United States Patent
Kato et al.

(10) Patent No.: US 10,023,673 B2
(45) Date of Patent: Jul. 17, 2018

(54) CURABLE COMPOSITION AND CURED PRODUCT THEREOF, METHOD FOR PRODUCING CURED PRODUCT, METHOD FOR MANUFACTURING OPTICAL COMPONENT, METHOD FOR MANUFACTURING CIRCUIT BOARD, AND METHOD FOR MANUFACTURING ELECTRONIC COMPONENT

(71) Applicant: CANON KABUSHIKI KAISHA, Tokyo (JP)

(72) Inventors: Jun Kato, Yokohama (JP); Youji Kawasaki, Utsunomiya (JP); Shiori Yonezawa, Tokyo (JP); Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/308,823

(22) PCT Filed: Apr. 28, 2015

(86) PCT No.: PCT/JP2015/002287
§ 371 (c)(1),
(2) Date: Nov. 3, 2016

(87) PCT Pub. No.: WO2015/170465
PCT Pub. Date: Nov. 12, 2015

(65) Prior Publication Data
US 2017/0183437 A1    Jun. 29, 2017

(30) Foreign Application Priority Data

May 9, 2014    (JP) .................. 2014-097768
Jul. 25, 2014   (JP) .................. 2014-151501
Dec. 19, 2014   (JP) .................. 2014-257799

(51) Int. Cl.
| | | |
|---|---|---|
| C08F 2/46 | (2006.01) | |
| C08F 2/50 | (2006.01) | |
| C08G 61/04 | (2006.01) | |
| C08F 222/10 | (2006.01) | |
| G03F 7/00 | (2006.01) | |
| C08F 220/10 | (2006.01) | |
| H05K 3/00 | (2006.01) | |
| H05K 3/06 | (2006.01) | |
| H01L 21/3065 | (2006.01) | |
| H01L 21/308 | (2006.01) | |
| H01L 21/033 | (2006.01) | |

(Continued)

(52) U.S. Cl.
CPC ...... *C08F 222/1006* (2013.01); *C08F 220/10* (2013.01); *C08F 222/10* (2013.01); *G03F 7/0002* (2013.01); *H01L 21/0332* (2013.01); *H01L 21/0337* (2013.01); *H01L 21/266* (2013.01); *H01L 21/3065* (2013.01); *H01L 21/3081* (2013.01); *H01L 21/3086* (2013.01); *H01L 21/4846* (2013.01); *H05K 3/0017* (2013.01); *H05K 3/061* (2013.01); *C08F 2222/1026* (2013.01); *H05K 2203/092* (2013.01)

(58) Field of Classification Search
CPC .............. C08F 222/1006; C08F 222/10; C08F 2222/1026; C08F 220/10; H01L 21/3065; H01L 21/0332; H01L 21/3086; H01L 21/3846; H01L 21/3081; H01L 21/0337; H01L 21/0266; H05K 3/0017; H05K 3/061; H05K 2203/092; G03F 7/0002
USPC ........... 522/38, 33, 6, 71, 189, 184, 1; 520/1
See application file for complete search history.

(56) References Cited

U.S. PATENT DOCUMENTS

2006/0108710 A1* 5/2006 Xu .................. B82Y 10/00
                                                264/293
2009/0047478 A1    2/2009 Zhang
(Continued)

FOREIGN PATENT DOCUMENTS

JP    2006-227419 A    8/2006
JP    2010-073811    *  4/2010
(Continued)

OTHER PUBLICATIONS

Yonezawa et al, JP 2010-073811 Part 1, Apr. 2, 2010 (Year: 2010).*
Yonezawa et al, JP 2010-073811 Part 2, Apr. 2, 2010 (Year: 2010).*

*Primary Examiner* — Jessica Whiteley
(74) *Attorney, Agent, or Firm* — Canon U.S.A., Inc. IP Division

(57) ABSTRACT

To provide a curable composition for nanoimprinting that can form a cured product that has a sufficiently cured surface and is less prone to a pattern collapse defect even when the curable composition is cured by a photo-nanoimprint method at a low exposure dose. To provide a nanoimprint method for forming such a cured product. To provide a cured product that is less prone to a pattern collapse defect even when cured at a low exposure dose, a method for producing such a cured product, a method for manufacturing an optical component, a method for manufacturing a circuit board, and a method for manufacturing an electronic component.

A curable composition that satisfies the formula (1) in a cured state:

$$Er_1/Er_2 \geq 1.10 \qquad (1)$$

wherein $Er_1$ denotes the surface reduced modulus (GPa) of a cured product of the curable composition, and $Er_2$ denotes the internal reduced modulus (GPa) of the cured product.

31 Claims, 2 Drawing Sheets

(51) Int. Cl.
*H01L 21/266* (2006.01)
*H01L 21/48* (2006.01)

(56) References Cited

U.S. PATENT DOCUMENTS

| | | | |
|---|---|---|---|
| 2016/0160003 A1* | 6/2016 | Kitagawa | C08F 2/44 428/195.1 |
| 2016/0187774 A1* | 6/2016 | Ito | G03F 7/0002 29/848 |
| 2016/0366769 A1* | 12/2016 | Honma | C08F 2/48 |

FOREIGN PATENT DOCUMENTS

| | | | |
|---|---|---|---|
| JP | 2010-073811 A | 4/2010 | |
| JP | 2015-054402 A | 3/2015 | |
| JP | 2015-128134 A | 7/2015 | |
| KR | 20110098692 A | 9/2011 | |
| WO | 2005/081071 A1 | 9/2005 | |
| WO | 2012/030570 A1 | 3/2012 | |
| WO | 2014/065136 A1 | 5/2014 | |
| WO | 15/030258 A1 | 3/2015 | |
| WO | 15/041154 A1 | 3/2015 | |
| WO | WO-2015030258 A1 * | 3/2015 | ................ C08F 2/44 |
| WO | WO-2015041154 A1 * | 3/2015 | ............ C03F 7/0002 |

\* cited by examiner

[Fig. 1]
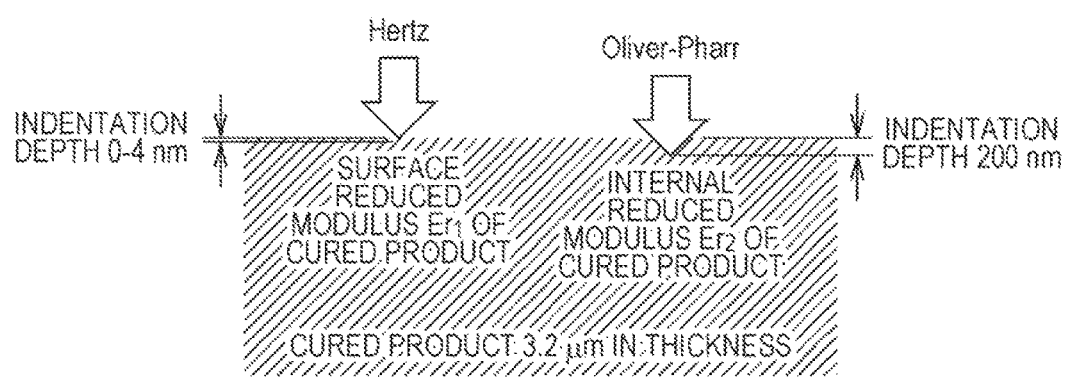

[Fig. 2A]
STEP [1]
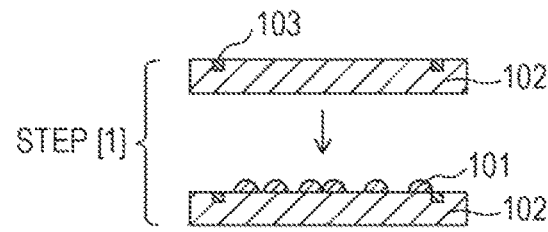
[Fig. 2B]
STEP [2]
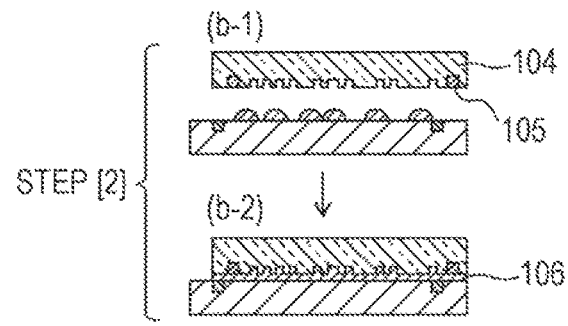
[Fig. 2C]
STEP [3]
[Fig. 2D]
STEP [4]
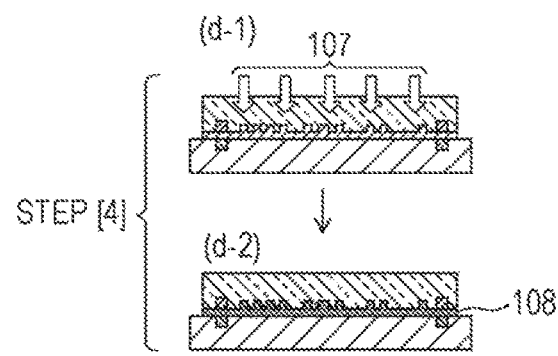
[Fig. 2E]
STEP [5]
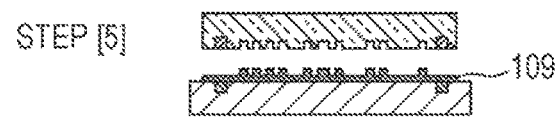
[Fig. 2F]
STEP [6]
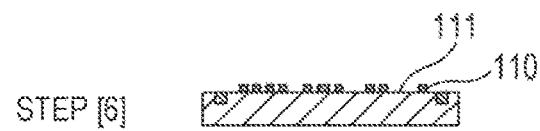
[Fig. 2G]
STEP [7]

CURABLE COMPOSITION AND CURED PRODUCT THEREOF, METHOD FOR PRODUCING CURED PRODUCT, METHOD FOR MANUFACTURING OPTICAL COMPONENT, METHOD FOR MANUFACTURING CIRCUIT BOARD, AND METHOD FOR MANUFACTURING ELECTRONIC COMPONENT

TECHNICAL FIELD

The present invention relates to a curable composition and a cured product thereof and to a method for producing a cured product.

BACKGROUND ART

There is a growing demand for fine semiconductor devices and microelectromechanical systems (MEMS). Thus, attention is being given to micro- and nano-fabrication technology that utilizes as a mold a resist (photocurable composition) pattern having a predetermined shape formed on a substrate (wafer), as well as to known photolithography technology. This technology is also referred to as a photo-nanoimprint technique and can be used to form a fine structure on the order of nanometers on a substrate (see, for example, PTL 1). In the photo-nanoimprint technique, a resist is first placed in a patterning region on a substrate (placement step). The resist is then patterned with a patterned mold (mold contact step). The resist is then cured by photoirradiation (photoirradiation step) and is removed (demolding step). Through these steps, a resin pattern (photo-cured product) having a predetermined shape is formed on the substrate. These steps can be performed multiple times in other regions on the substrate to form fine structures over the substrate.

CITATION LIST

Patent Literature

PTL 1: Japanese Patent Laid-Open No. 2010-073811

SUMMARY OF INVENTION

Technical Problem

In the photoirradiation step of the photo-nanoimprint technique, however, a decreased exposure time, that is, a decreased exposure dose of the resist in order to improve throughput results in incomplete curing of the photocurable composition, causes a defect called pattern collapse in the demolding step, and unexpectedly results in a low yield.

When the curing is incomplete, pattern collapse tends to also occur in another step after the demolding step. For example, in the photo-nanoimprint technique, a series of steps (shot) from the placement step to the demolding step are often performed multiple times on a single substrate, and pattern collapse can occur during these steps.

The present invention provides a curable composition for nanoimprinting that can form a cured product that has a sufficiently cured surface and is less prone to a pattern collapse defect even when the curable composition is cured by a photo-nanoimprint method at a low exposure dose. The present invention also provides a nanoimprint method for forming such a cured product. The present invention also provides a cured product that is less prone to a pattern collapse defect even when cured at a low exposure dose, a method for producing such a cured product, a method for manufacturing an optical component, a method for manufacturing a circuit board, and a method for manufacturing an electronic component.

The present invention provides a curable composition that satisfies the following formula (1) in a cured state:

$$Er_1/Er_2 \geq 1.10 \qquad (1)$$

wherein $Er_1$ denotes the surface reduced modulus (GPa) of a cured product of the curable composition, and $Er_2$ denotes the internal reduced modulus (GPa) of the cured product.

In accordance with the present invention, a curable composition that satisfies the formula (1) in a cured state can be used to form a cured product that is less prone to a pattern collapse defect even when the curable composition is cured at a low exposure dose. The present invention can also provide a cured product that is less prone to a pattern collapse defect even when cured at a low exposure dose, a method for producing such a cured product, a method for manufacturing an optical component, a method for manufacturing a circuit board, and a method for manufacturing an electronic component.

Further features of the present invention will become apparent from the following description of exemplary embodiments with reference to the attached drawings.

BRIEF DESCRIPTION OF DRAWINGS

FIG. 1 is a schematic cross-sectional view illustrating a method for measuring the surface reduced modulus and internal reduced modulus of a cured product according to an embodiment of the present invention.

FIG. 2A is a schematic cross-sectional view illustrating a method for producing a cured product according to an embodiment of the present invention.

FIG. 2B is a schematic cross-sectional view illustrating a method for producing a cured product according to an embodiment of the present invention.

FIG. 2C is a schematic cross-sectional view illustrating a method for producing a cured product according to an embodiment of the present invention.

FIG. 2D is a schematic cross-sectional view illustrating a method for producing a cured product according to an embodiment of the present invention.

FIG. 2E is a schematic cross-sectional view illustrating a method for producing a cured product according to an embodiment of the present invention.

FIG. 2F is a schematic cross-sectional view illustrating a method for producing a cured product according to an embodiment of the present invention.

FIG. 2G is a schematic cross-sectional view illustrating a method for producing a cured product according to an embodiment of the present invention.

DESCRIPTION OF EMBODIMENTS

Embodiments of the present invention will be described in detail below with reference to the accompanying drawings.

Curable Composition

A curable composition according to the present embodiment satisfies the following formula (1) in a cured state:

$$Er_1/Er_2 \geq 1.10 \qquad (1)$$

wherein $Er_1$ denotes the surface reduced modulus (GPa) of a cured product of the curable composition, and $Er_2$ denotes the internal reduced modulus (GPa) of the cured product.

A curable composition according to the present embodiment can be realized by appropriately choosing the type and concentration of each component of the composition. A curable composition according to the present embodiment can also be realized by choosing the composition such that a component of the curable composition has a concentration distribution.

A curable composition according to the present embodiment can contain the following components (A) and (B).

Component (A): Polymerizable compound
Component (B): Photopolymerization initiator The term "cured product", as used herein, refers to a product formed by curing part or all of a curable composition by polymerization. A cured product having an excessively small thickness with respect to the area thereof is sometimes referred to as a cured film for emphasis.

A curable composition according to the present embodiment and a cured product thereof can have a particular pattern on a substrate.

The components will be described in detail below.

<Component (A): Polymerizable Compound>

The component (A) is a polymerizable compound. The term "polymerizable compound", as used herein, refers to a compound that reacts with a polymerizing factor (such as a radical) generated from a photopolymerization initiator (component (B)) and forms a polymer compound film through a chain reaction (polymerization reaction).

For example, the polymerizable compound may be a radical polymerizable compound. The polymerizable compound component (A) may be composed of a polymerizable compound or two or more polymerizable compounds.

The polymerizable compound component (A) can be all the polymerizable compound component(s) of a curable composition according to the present embodiment. In this case, the curable composition may be composed of a polymerizable compound alone or two or more particular polymerizable compounds.

The radical polymerizable compound can be a compound having at least one acryloyl or methacryloyl group, that is, a (meth)acrylic compound.

Thus, a curable composition according to the present embodiment can contain a (meth)acrylic compound as the component (A). The component (A) can be composed mainly of a (meth)acrylic compound. All the polymerizable compound component(s) of the curable composition can be a (meth)acrylic compound. The sentence "the component (A) is composed mainly of a (meth)acrylic compound", as used herein, means that 90% by weight or more of the component (A) is the (meth)acrylic compound.

When the radical polymerizable compound is composed of two or more compounds having at least one acryloyl or methacryloyl group, the radical polymerizable compound can contain a monofunctional acrylic monomer and a polyfunctional acrylic monomer. This is because a combination of a monofunctional acrylic monomer and a polyfunctional acrylic monomer can form a cured film having high mechanical strength.

Examples of a monofunctional (meth)acrylic compound having one acryloyl or methacryloyl group include, but are not limited to, phenoxyethyl (meth)acrylate, phenoxy-2-methylethyl (meth)acrylate, phenoxyethoxyethyl (meth) acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, 1-naphthylmethyl (meth) acrylate, 2-naphthylmethyl (meth)acrylate, tetrahydrofurfuryl (meth)acrylate, butoxyethyl (meth)acrylate, ethoxydiethylene glycol (meth)acrylate, poly(ethylene glycol) mono(meth)acrylate, poly(propylene glycol) mono (meth)acrylate, methoxyethylene glycol (meth)acrylate, ethoxyethyl (meth)acrylate, methoxypoly(ethylene glycol) (meth)acrylate, methoxypoly(propylene glycol) (meth)acrylate, diacetone (meth)acrylamide, isobutoxymethyl (meth) acrylamide, N,N-dimethyl (meth)acrylamide, t-octyl (meth) acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products of a monofunctional (meth)acrylic compound include, but are not limited to, Aronix M101, M102, M110, M111, M113, M117, M5700, TO-1317, M120, M150, and M156 (manufactured by Toagosei Co., Ltd.), MEDOL-10, MIBDOL-10, CHDOL-10, MMDOL-30, MEDOL-30, MIBDOL-30, CHDOL-30, LA, IBXA, 2-MTA, HPA, and Viscoat #150, #155, #158, #190, #192, #193, #220, #2000, #2100, and #2150 (manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, and NP-8EA, and Epoxy Ester M-600A (manufactured by Kyoeisha Chemical Co., Ltd.), Kayarad TC110S, R-564, and R-128H (manufactured by Nippon Kayaku Co., Ltd.), NK ester AMP-10G and AMP-20G (manufactured by Shin Nakamura Chemical Co., Ltd.), FA-511A, 512A, and 513A (manufactured by Hitachi Chemical Co., Ltd.), PHE, CEA, PHE-2, PHE-4, BR-31, BR-31M, and BR-32 (manufactured by Dai-ichi Kogyo Seiyaku Co., Ltd.), VP (manufactured by BASF), and ACMO, DMAA, and DMAPAA (manufactured by Kohjin Co., Ltd.).

Examples of a polyfunctional (meth)acrylic compound having two or more acryloyl or methacryloyl groups include, but are not limited to, trimethylolpropane di(meth) acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetra-ethylene glycol di(meth)acrylate, phenylethylene glycol di(meth)acrylate, poly(ethylene glycol) di(meth)acrylate, poly(propylene glycol) di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantanedimethanol di(meth)acrylate, o-xylylene di(meth)acrylate, m-xylylene di(meth)acrylate, p-xylylene di(meth)acrylate, tris(2-hydroxyethyl)isocyanurate tri(meth)acrylate, tris(acryloyloxy) isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercial products of a polyfunctional (meth)acrylic compound include, but are not limited to, Yupimer UV SA1002 and SA2007 (manufactured by Mitsubishi Chemical Corp.), Viscoat #195, #230, #215, #260, #335HP, #295, #300. #360, #700, GPT, and 3PA (manufactured by Osaka Organic Chemical Industry Ltd.), Light Acrylate 4EG-A, 9EG-A, NP-A, DCP-A, BP-4EA, BP-4PA, TMP-A, PE-3A, PE-4A, and DPE-6A (manufactured by Kyoeisha Chemical Co., Ltd.), Kayarad PET30, TMPTA, R-604, DPHA, DPCA-20, -30, -60, and -120, HX-620, D-310, and D-330 (manufactured by Nippon Kayaku Co., Ltd.), Aronix M208, M210, M215, M220, M240, M305, M309, M310, M315, M325, and M400 (manufactured by Toagosei Co., Ltd.), and Ripoxy VR-77, VR-60, and VR-90 (manufactured by Showa Denko K.K.).

The term "(meth)acrylate" in these compounds refers to an acrylate or a methacrylate having the same alcohol residue as its corresponding acrylate. The term "(meth)acryloyl group" refers to an acryloyl group or a methacryloyl group having the same alcohol residue as its corresponding acryloyl group. EO refers to ethylene oxide. An EO-modified compound A refers to a compound in which a (meth)acrylic acid residue and an alcohol residue of the compound A are bound together through an ethylene oxide group block structure. PO refers to propylene oxide. A PO-modified compound B refers to a compound in which a (meth)acrylic acid residue and an alcohol residue of the compound B are bound together through a propylene oxide group block structure.

Among these, the component (A) may contain at least one or at least two of isobornyl acrylate, benzyl acrylate, 2-naphthylmethyl acrylate, dicyclopentanyl acrylate, m-xylylene diacrylate, dimethyloltricyclodecane diacrylate, phenylethylene glycol diacrylate, 1,10-decanediol diacrylate, and neopentyl glycol diacrylate. The component (A) can be composed of isobornyl acrylate, benzyl acrylate, and neopentyl glycol diacrylate, or benzyl acrylate and m-xylylene diacrylate, or benzyl acrylate, 2-naphthylmethyl acrylate, and m-xylylene diacrylate, or benzyl acrylate and dimethyloltricyclodecane diacrylate, or benzyl acrylate and phenylethylene glycol diacrylate, or dicyclopentanyl acrylate and m-xylylene diacrylate, or isobornyl acrylate and 1,10-decanediol diacrylate.

The component (A) can be composed mainly of a (meth)acrylic compound, and 20% by weight or more of the component (A) can be a polyfunctional (meth)acrylic compound. In this case, the resulting cured product can have not only high mechanical strength due to cross-linking but also low cure shrinkage and high pattern accuracy.

The component (A) can be composed mainly of a (meth)acrylic compound, and 30% by weight or more of the component (A) can be a (meth)acrylic compound having a ring structure. In this case, the resulting cured product can have higher mechanical strength.

The component (A) can be composed mainly of dicyclopentanyl acrylate and m-xylylene diacrylate, and the weight ratio of dicyclopentanyl acrylate to m-xylylene diacrylate can range from 40:60 to 60:40. The resulting cured product can have a good balance between various properties, such as mechanical strength, curing rate, cure shrinkage, dry etch resistance, heat resistance, and PFP process compatibility.

<Component (B): Photopolymerization Initiator>

The component (B) is a photopolymerization initiator.

In the present embodiment, a photopolymerization initiator is a compound that senses light having a predetermined wavelength and generates a polymerizing factor (radical). More specifically, a photopolymerization initiator is a polymerization initiator (radical generator) that can generate a radical when induced by light (for example, infrared light, visible light, ultraviolet light, far-ultraviolet light, X-rays, charged particle beams, such as an electron beam, or radiation).

The component (B) may be composed of a photopolymerization initiator or two or more photopolymerization initiators.

Examples of the radical generator include, but are not limited to, optionally substituted 2,4,5-triarylimidazole dimers, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives, such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives, such as 2-benzyl-2-dimethylamino-1-(4-morpholinophenyl)-butanone-1,2-methyl-1-[4-(methyl thio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone: benzoin ether derivatives, such as benzoin methyl ether, benzoin ethyl ether, and benzoin phenyl ether; benzoin derivatives, such as benzoin, methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone derivatives, such as acetophenone, 3-methylacetophenone, acetophenone benzyl ketal, 1-hydroxycyclohexyl phenyl ketone, and 2,2-dimethoxy-2-phenylacetophenone; thioxanthone derivatives, such as thioxanthone, diethylthioxanthone, 2-isopropylthioxanthone, and 2-chlorothioxanthone; acylphosphine oxide derivatives, such as 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide; oxime ester derivatives, such as 1,2-octanedione,1-[4-(phenylthio)-,2-(O-benzoyloxime)] and ethanone,1-[9-ethyl-6-(2-methylbenzoyl)-9H-carbazol-3-yl]-,1-(O-acetyloxime); xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenylpropan-1-one.

Examples of commercial products of the radical generator include, but are not limited to, Irgacure 184, 369, 651, 500, 819, 907, 784, 2959, CGI-1700, -1750, and -1850, CG24-61, Darocur 1116 and 1173, Lucirin TPO, LR8893, and LR8970 (manufactured by BASF), and Uvecryl P36 (manufactured by Sigma-Aldrich GmbH).

Among these, the component (B) of a curable composition according to the present embodiment may contain at least one of alkylphenone polymerization initiators and acylphosphine oxide polymerization initiators.

Among the examples, alkylphenone polymerization initiators are benzoin ether derivatives, such as benzoin methyl ether, benzoin ethyl ether, and benzoin phenyl ether, benzoin derivatives, such as benzoin, methylbenzoin, ethylbenzoin, and propylbenzoin; benzyl derivatives, such as benzyl dimethyl ketal; acetophenone derivatives, such as acetophenone, 3-methylacetophenone, acetophenone benzyl ketal, 1-hydroxycyclohexyl phenyl ketone, and 2,2-dimethoxy-2-phenylacetophenone: and α-amino aromatic ketone derivatives, such as 2-benzyl-2-dimethylamino-1-(4-morpholinophenyl)-butanone-1 and 2-methyl-1-[4-(methylthio)phenyl]-2-morpholinopropan-1-one.

Among the examples, acylphosphine oxide polymerization initiators are acylphosphine oxide compounds, such as 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide.

Among these, the component (B) may be benzyl dimethyl ketal represented by the following formula (a), 2-benzyl-2-dimethylamino-1-(4-morpholinophenyl)-butanone-1 represented by the following formula (b), or 2,4,6-trimethylbenzoyldiphenylphosphine oxide represented by the following formula (f).

[Chem. 1]

Formula (a)

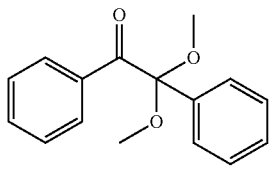

[Chem. 2]

Formula (b)

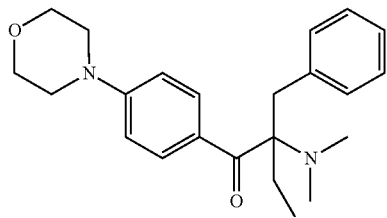

[Chem. 3]

Formula (f)

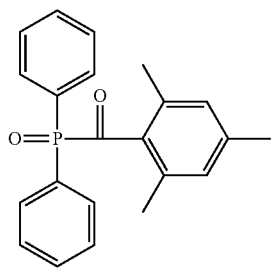

The percentage of the photopolymerization initiator component (B) in a curable composition according to the present embodiment is 0.01% by weight or more and 10% by weight or less, preferably 0.1% by weight or more and 7% by weight or less, of the total amount of the polymerizable compound component (A).

When the percentage of the component (B) is 0.01% by weight or more of the total amount of the polymerizable compound, a curable composition according to the present embodiment can have a high curing rate and high reaction efficiency. When the percentage of the component (B) is 10% by weight or less of the total amount of the polymerizable compound, the resulting cured product has certain mechanical strength.

The component (B) can contain at least one of 2-benzyl-2-dimethylamino-1-(4-morpholinophenyl)-butanone-1 and 2,4,6-trimethylbenzoyldiphenylphosphine oxide. In this case, a curable composition for nanoimprinting according to the present embodiment can form a cured product that has a sufficiently cured surface and is less prone to a pattern collapse defect without an additive component (C).

The component (A) can be composed mainly of dicyclopentanyl acrylate and m-xylylene diacrylate, the weight ratio of dicyclopentanyl acrylate to m-xylylene diacrylate ranges from 40:60 to 60:40, and the amount of component (B) ranges from 0.01% to 10% by weight of the total amount of the component (A). The resulting cured product can have a good balance between various properties, such as mechanical strength, curing rate, cure shrinkage, dry etch resistance, heat resistance, and PFP process compatibility.

<Another Additive Component (C)>

In addition to the component (A) and the component (B), a curable composition according to the present embodiment may contain an additive component (C) depending on the purpose without losing the advantages of the present invention. Examples of the additive component (C) include, but are not limited to, a sensitizer, a hydrogen donor, an internal release agent, a surfactant, an antioxidant, a solvent, a polymer component, and a polymerization initiator other than the component (B).

A sensitizer is a compound appropriately added to promote a polymerization reaction and improve the reaction conversion. A sensitizer may be a sensitizing dye.

A sensitizing dye is a compound that is excited by absorbing light having a particular wavelength and interacts with the photopolymerization initiator component (B). The interaction may be energy transfer or electron transfer from an excited sensitizing dye to the photopolymerization initiator component (B).

Specific examples of the sensitizing dye include, but are not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

These sensitizers may be used alone or in combination of two or more thereof.

Among these, the sensitizer may be a sensitizer having a benzophenone structure.

The sensitizer having a benzophenone structure is a benzophenone compound, such as a 4,4'-bis(dialkylamino) benzophenone.

Among these, the sensitizer may be 4,4'-bis(diethylamino)benzophenone represented by the following formula (g).

[Chem. 4]

Formula (g)

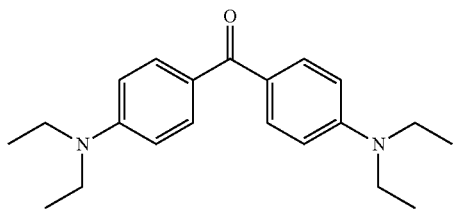

At least one sensitizer having a benzophenone structure can be added as a sensitizer. A sensitizer having a benzophenone structure can improve the curing rate without decreasing mechanical strength.

A hydrogen donor is a compound that reacts with an initiator radical generated from the photopolymerization initiator component (B) or a radical at the polymerization growth terminal to form a more reactive radical. A hydrogen donor can be added when the photopolymerization initiator component (B) is a photo radical generator.

Specific examples of the hydrogen donor include, but are not limited to, amine compounds, such as n-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino)benzophenones, ethyl N,N-dimethylaminobenzoate, isoamyl N,N-dimethylaminobenzoate, pentyl-4-dimethylaminobenzoate, triethanolamine, and N-phenylglycine; and mercapto compounds, such as 2-mercapto-N-phenylbenzimidazole and mercaptopropionic acid esters.

These hydrogen donors may be used alone or in combination of two or more thereof.

The hydrogen donor may have a function of a sensitizer. A hydrogen donor having a function of a sensitizer may be a 4,4'-bis(dialkylamino)benzophenone.

4,4'-bis(dialkylamino)benzophenones include 4,4'-bis(diethylamino)benzophenone and derivatives thereof. Among these, 4,4'-bis(diethylamino)benzophenone represented by the following formula (f) may be used.

[Chem. 5]

Formula (g)

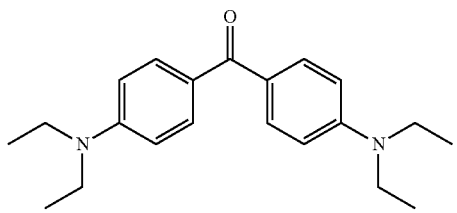

At least one hydrogen donor having a benzophenone structure can be added as a hydrogen donor. A hydrogen donor having a benzophenone structure can improve the curing rate without decreasing mechanical strength.

When a curable composition according to the present embodiment contains a sensitizer and/or a hydrogen donor as an additive component (C), the amount of each additive component (C) is preferably 0% by weight or more and 20% by weight or less, more preferably 0.1% by weight or more and 5.0% by weight or less, still more preferably 0.2% by weight or more and 2.0% by weight or less, of the total amount of the polymerizable compound component (A). When the sensitizer content is 0.1% by weight or more of the total amount of the component (A), the polymerization promoting effect becomes more effective. When the sensitizer or hydrogen donor content is 5.0% by weight or less, a polymer compound constituting the resulting photo-cured product can have a sufficiently high molecular weight, and poor dissolution of the sensitizer or hydrogen donor in the curable composition and deterioration of storage stability of the curable composition can be suppressed.

An internal release agent can be added to a curable composition according to the present embodiment in order to decrease the interfacial bond strength between a mold and a resist, that is, the demolding force in the demolding step. The term "internal", as used herein in the context of an additive, means that the additive is added in advance to a curable composition before the placement step.

The internal release agent may be a surfactant, such as a silicone surfactant, a fluorosurfactant, or a hydrocarbon surfactant. In the present embodiment, the internal release agent has no polymerization reactivity.

Examples of the fluorosurfactant include, but are not limited to, poly(alkylene oxide) (such as poly(ethylene oxide) or poly(propylene oxide)) adducts of alcohols having a perfluoroalkyl group and poly(alkylene oxide) (such as poly(ethylene oxide) or poly(propylene oxide)) adducts of perfluoropolyethers. The fluorosurfactant may have a hydroxyl group, an alkoxy group, an alkyl group, an amino group, and/or a thiol group as part of its molecular structure (for example, as an end group).

The fluorosurfactant may be a commercial product. Examples of the commercial product include, but are not limited to, Megaface F-444, TF-2066, TF-2067, and TF-2068 (manufactured by DIC Corporation), Fluorad FC-430 and FC-431 (manufactured by Sumitomo 3M Ltd.), Surflon S-382 (manufactured by AGC Seimi Chemical Co., Ltd.), EFTOP EF-122A, 122B, 122C, EF-121, EF-126, EF-127, and MF-100 (manufactured by Tohkem Products Corporation), PF-636, PF-6320, PF-656, and PF6520 (manufactured by OMNOVA Solutions Inc.), Unidyne DS-401, DS-403, and DS451 (manufactured by Daikin Industries, Ltd.), and Ftergent 250, 251, 222F, and 208G (manufactured by NEOS Co. Ltd.).

Among these fluorosurfactants, the internal release agent may be a poly(alkylene oxide) adduct of an alcohol having a perfluoroalkyl group. The internal release agent may be a compound represented by the following formula (c).

[Chem. 6]

Formula (c)

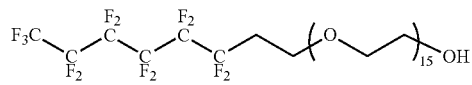

The internal release agent may be a hydrocarbon surfactant.

The hydrocarbon surfactant may be an alkyl alcohol poly(alkylene oxide) adduct in which an alkylene oxide having 2 to 4 carbon atoms is added to an alkyl alcohol having 1 to 50 carbon atoms.

Examples of the alkyl alcohol poly(alkylene oxide) adduct include, but are not limited to, methyl alcohol ethylene oxide adducts, decyl alcohol ethylene oxide adducts, lauryl alcohol ethylene oxide adducts, cetyl alcohol ethylene oxide adducts, stearyl alcohol ethylene oxide adducts, and stearyl alcohol ethylene oxide/propylene oxide adducts. An end group of the alkyl alcohol poly(alkylene oxide) adduct is not limited to a hydroxyl group resulting from simple addition of poly(alkylene oxide) to an alkyl alcohol. This hydroxyl group may be substituted by another substituent, for example, a polar functional group, such as a carboxyl group, an amino group, a pyridyl group, a thiol group, or a silanol group, or a hydrophobic functional group, such as an alkyl group or an alkoxy group.

The alkyl alcohol poly(alkylene oxide) adduct may be a commercial product. Examples of the commercial product include, but are not limited to, polyoxyethylene methyl ethers (methyl alcohol ethylene oxide adducts) manufactured by Aoki Oil Industrial Co., Ltd. (BLAUNON MP-400, MP-550, and MP-1000), polyoxyethylene decyl ethers (decyl alcohol ethylene oxide adducts) manufactured by Aoki Oil Industrial Co., Ltd. (FINESURF D-1303, D-1305, D-1307, and D-1310), a polyoxyethylene lauryl ether (lauryl alcohol ethylene oxide adducts) manufactured by Aoki Oil Industrial Co., Ltd. (BLAUNON EL-1505), polyoxyethylene cetyl ethers (cetyl alcohol ethylene oxide adducts) manufactured by Aoki Oil Industrial Co., Ltd. (BLAUNON CH-305 and CH-310), polyoxyethylene stearyl ethers (stearyl alcohol ethylene oxide adducts) manufactured by Aoki Oil Industrial Co., Ltd. (BLAUNON SR-705, SR-707, SR-715, SR-720, SR-730, and SR-750), random polymerization type polyoxyethylene polyoxypropylene stearyl ethers manufactured by Aoki Oil Industrial Co., Ltd. (BLAUNON SA-50/50 1000R and SA-30/70 2000R), a polyoxyethylene methyl ether manufactured by BASF (Pluriol A760E), and polyoxyethylene alkyl ethers manufactured by Kao Corporation (Emulgen series).

Among these hydrocarbon surfactants, the internal release agent may be an alkyl alcohol poly(alkylene oxide) adduct or a long-chain alkyl alcohol poly(alkylene oxide) adduct. The internal release agent may be a compound represented by the following formula (d), (h), or (i).

When a curable composition according to the present embodiment contains an internal release agent, the internal release agent can be at least one of fluorosurfactants and hydrocarbon surfactants.

When a curable composition according to the present embodiment contains an internal release agent as an additive component (C), the internal release agent content may be 0.001% by weight or more and 10% by weight or less, preferably 0.01% by weight or more and 7% by weight or less, more preferably 0.05% by weight or more and 5% by weight or less, of the total amount of the polymerizable compound component (A).

When the internal release agent content is 0.001% by weight or more and 10% by weight or less, the curable composition can form a cured product that has a sufficiently cured surface and is less prone to a pattern collapse defect even when the curable composition is cured at a low exposure dose. This also improves the effect of decreasing demolding force and/or improves the filling property.

A curable composition according to the present embodiment can be a composition for photo-nanoimprinting.

The percentages of the component (A) and the component (B) can be determined by infrared spectroscopy, ultraviolet-visible spectroscopy, or pyrolysis gas chromatography-mass spectrometry of a curable composition according to the present embodiment and/or a cured product thereof. As a result, the percentages of the component (A) and the component (B) in the curable composition can be determined. When a curable composition according to the present embodiment contains an additive component (C), the percentages of the component (A), the component (B), and the additive component (C) in the curable composition can be determined in the same manner.

<Temperature of Curable Composition in Blending>

In the preparation of a curable composition according to the present embodiment, at least the component (A) and the component (B) are mixed and dissolved under predetermined temperature conditions. More specifically, the temperature is 0° C. or more and 100° C. or less. The additive component (C) is also mixed and dissolved in the same manner.

<Viscosity of Curable Composition>

A mixture of the components of a curable composition according to the present embodiment other than the solvent thereof preferably has a viscosity of 1 cP or more and 100 cP or less, more preferably 1 cP or more and 50 cP or less,

[Chem. 7]

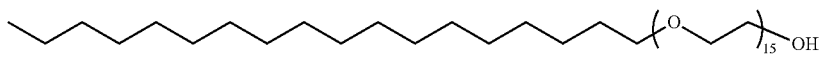

Formula (d)

[Chem. 8]

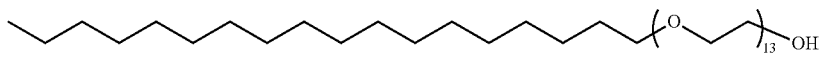

Formula (h)

[Chem. 9]

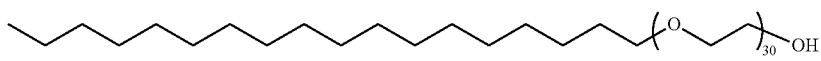

Formula (i)

The internal release agents may be used alone or in combination of two or more thereof.

still more preferably 1 cP or more and 20 cP or less, at 23° C.

A curable composition having a viscosity of 100 cP or less can fill into a recessed portion of a micro- and/or nano-pattern on a mold in a short time when the mold pattern comes into contact with the curable composition. The cured product is less prone to a pattern defect due to incomplete filling.

A curable composition having a viscosity of 1 cP or more can be uniformly applied to a substrate and can make less flow out of a mold edge.

<Surface Tension of Curable Composition>

A mixture of the components of a curable composition according to the present embodiment other than the solvent thereof preferably has a surface tension of 5 mN/m or more and 70 mN/m or less, more preferably 7 mN/m or more and 35 mN/m or less, still more preferably 10 mN/m or more and 32 mN/m or less, at 23° C. A curable composition having a surface tension of 5 mN/m or more can flow into a recessed portion of a micro- and/or nano-pattern on a mold in a short time.

A cured product of a curable composition having a surface tension of 70 mN/m or less has a smooth surface.

<Impurities in Curable Composition>

A curable composition according to the present embodiment contains as few impurities as possible. The impurities refer to components other than the component (A), the component (B), and the additive component (C).

Thus, a curable composition according to the present embodiment can be subjected to a purification step. The purification step can be filtration through a filter.

For filtration through a filter, a mixture of the component (A), the component (B), and the optional additive component (C) can be passed through a filter, for example, having a pore size of 0.001 μm or more and 5.0 μm or less. For filtration through a filter, the filtration can be performed in multiple stages or multiple times. A filtered liquid may be filtered again. A plurality of filters having different pore sizes may be used. A filter for filtration may be, but is not limited to, a polyethylene filter, a polypropylene filter, a fluoropolymer filter, or a nylon filter.

Impurities, such as particles, in a curable composition according to the present embodiment can be removed in the purification step. This can prevent impurities, such as particles, from accidentally forming asperities to cause a pattern defect on a cured product of the curable composition.

When a curable composition according to the present embodiment is used for the manufacture of semiconductor integrated circuits, it is desirable to avoid contamination of the curable composition with impurities containing metal atoms (metal impurities) so as not to affect the operation of the product. To this end, the concentration of metal impurities in a curable composition according to the present embodiment is preferably 10 ppm or less, more preferably 100 ppb or less.

Cured Product

A cured product can be prepared by curing a curable composition according to the present embodiment. In this case, a coating film of the curable composition can be cured. A specific example of a method for forming a coating film of a curable composition is described in a placement step [1] of a method for producing a patterned cured product described below. A specific example of a method for curing a coating film is described in a method for irradiating a curable composition with light in a photoirradiation step [4] in a method for producing a patterned cured product.

<Measurement of Reduced Modulus of Cured Product>

The reduced modulus of a cured product can be measured by nanoindentation. In nanoindentation, an indenter is forced into a desired portion of a sample, and the load and displacement are simultaneously measured. The hardness and reduced modulus of the sample can be determined from the relationship between the load and displacement. When the reduced modulus of a cured product on a substrate is measured as in the present embodiment, the indentation depth is determined such that the substrate does not affect the measurement.

The specific measuring apparatus may be Nano Indenter G200 (manufactured by Agilent Technologies), ENT series (manufactured by Elionix Inc.), or TI series (manufactured by Hysitron Corporation). Particularly in the present invention, it is desirable to use a measuring apparatus that can control and measure a small displacement and a small load required for measurement in a very thin surface layer (a depth of less than 10 nm from a surface) of a cured product.

A curable composition according to the present embodiment satisfies the following formula (1) in a cured state, wherein $Er_1$ denotes the surface reduced modulus (GPa) of a cured product of the curable composition, and $Er_2$ denotes the internal reduced modulus (GPa) of the cured product.

$$Er_1/Er_2 \geq 1.10 \quad (1)$$

The surface reduced modulus $Er_1$ (GPa) of a cured product can be measured as an average reduced modulus in a depth range of 4 nm or less from a surface of the cured product by determining the relationship between load (P) and displacement (indentation depth h) while the surface is indented with an indenter to an indentation depth of approximately 10 nm with a TI-950 TriboIndenter (manufactured by Hysitron Corporation), determining the slope $P^{2/3}/h$ in a region in which a "$P^{2/3}$ vs. h" line is substantially straight (immediately after loading, at an indentation depth in the range of 0 to 4 nm) by the Hertz method, and substituting the slope $P^{2/3}/h$ into the following mathematical formula (1).

In the mathematical formula (1), R denotes the tip radius of the indenter used for the measurement. The indenter tip radius R can be determined using this formula from nanoindentation of a standard sample having a known modulus.

[Math. 1]

$$Er_1 = \frac{3}{4}\left(\frac{1}{R^{1/2}} \frac{P}{h^{3/2}}\right) \quad \text{Formula (1)}$$

The internal reduced modulus $Er_2$ (GPa) of the cured product can be measured at a depth of 200 nm from a surface of the cured product by determining the relationship between load (P) and displacement (indentation depth h) while the surface of the cured product is indented with an indenter to an indentation depth of 200 nm with a TI-950 Triboindenter (manufactured by Hysitron Corporation) and substituting the slope S of a tangent line of the "P vs. h" curve immediately after unloading into the following mathematical formula (2) by the Oliver-Pharr method. In the mathematical formula (2), $A_c$ denotes the contact projected area, which depends on the indenter used for the measurement and the indentation depth. The contact projected area A can be determined from a calibration curve (the relationship between the indentation depth and the contact projected area of the indenter) obtained using this formula from nanoindentation of a standard sample having a known modulus.

[Math. 2]

$$Er_2 = \frac{S\sqrt{\pi}}{2\sqrt{A_c}} \quad \text{Formula (2)}$$

The thickness of a cured product subjected to the measurement of a reduced modulus can be 2.0 μm or more. The reduced modulus of a cured product can be measured, for example, 24 hours after a curable composition is cured.

FIG. 1 is a schematic cross-sectional view illustrating a method for measuring the surface reduced modulus and internal reduced modulus of a cured product according to the present embodiment.

A curable composition that satisfies the formula (1) can form a cured product that has a sufficiently cured surface and is less prone to a pattern collapse defect even when the curable composition is cured at a low exposure dose.

The curable composition can also satisfy the formula (2) in a cured state.

$$Er_1/Er_2 \geq 1.40 \quad (2)$$

$Er_1$ and $Er_2$ in the formula (2) are the same as $Er_1$ and $Er_2$ in the formula (1). Thus, $Er_1$ can be measured as an average reduced modulus (GPa) in a depth range of 4 nm or less from a surface of the cured product, and $Er_2$ can be measured as a reduced modulus (GPa) at a depth of 200 nm from the surface of the cured product.

The curable composition can also satisfy the following formula (3) as well as the formula (1) or (2) in a cured state.

$$Er_1 \geq 3.00 \text{ GPa} \quad (3)$$

The curable composition can also satisfy the formula (4) in a cured state.

$$Er_1 \geq 3.50 \text{ GPa} \quad (4)$$

$Er_1$ in the formulae (3) and (4) is the same as $Er_1$ in the formula (1) or (2) and denotes an average reduced modulus (GPa) in a depth range of 4 nm or less from the surface of the cured product.

Method for Producing Patterned Cured Product

A method for producing a patterned cured product according to the present embodiment will be described below.

FIGS. 2A to 2G are schematic cross-sectional views illustrating an example of a method for producing a patterned cured product according to the present embodiment.

A method for producing a patterned cured product according to the present embodiment includes

[1] a placement step of placing a curable composition according to the present embodiment on a substrate,

[2] a mold contact step of bringing the curable composition into contact with a mold,

[3] an aligning step of aligning the substrate with the mold,

[4] a photoirradiation step of irradiating the curable composition with light, and

[5] a demolding step of separating a cured product formed in the step [4] from the mold.

A method for producing a patterned cured product according to the present embodiment is a method for producing a film by a photo-nanoimprint method.

A cured product produced by a method for producing a patterned cured product according to the present embodiment is preferably a film having a pattern having a size of 1 nm or more and 10 mm or less, more preferably a film having a pattern having a size of 10 nm or more and 100 μm or less. In general, a patterning technique for forming a film having a nanoscale (1 nm or more and 100 nm or less) pattern (textured structure) utilizing light is referred to as a photo-nanoimprint method. A method for producing a patterned cured product according to the present embodiment utilizes the photo-nanoimprint method.

Each of the steps will be described below.

<Placement Step [1]>

In this step (placement step), as illustrated in FIG. 2A, a curable composition 101 according to the present embodiment is placed on (applied to) a substrate 102 to form a coating film.

The substrate 102 on which the curable composition 101 is to be placed is a workpiece substrate and is generally a silicon wafer.

In the present embodiment, the substrate 102 is not limited to a silicon wafer and may be a known substrate for use in semiconductor devices, such as an aluminum, titanium-tungsten alloy, aluminum-silicon alloy, aluminum-copper-silicon alloy, silicon oxide, or silicon nitride substrate. The substrate 102 (workpiece substrate) may be a substrate that is subjected to surface treatment, such as silane coupling treatment, silazane treatment, or formation of an organic thin film, to improve adhesion to a curable composition.

In the present embodiment, a curable composition can be placed on the workpiece substrate by an ink jet method, a dip coating method, an air knife coating method, a curtain coating method, a wire bar coating method, a gravure coating method, an extrusion coating method, a spin coating method, or a slit scanning method. An ink jet method may be used for the photo-nanoimprint method. The thickness of a layer to which a pattern is to be transferred (a coating film) depends on the application and may be 0.01 μm or more and 100.0 μm or less.

<Mold Contact Step [2]>

As illustrated in FIG. 2B, the curable composition 101 is then brought into contact with a mold 104 having an original pattern that is to be transferred to the coating film of the curable composition 101 formed in the previous step (placement step). When the curable composition 101 (a layer to which a pattern is to be transferred) is brought into contact with the mold 104 in the present step (FIG. 2B(b-1)), recessed portions of a micro- and/or nano-pattern on a surface of the mold 104 are filled with (part of) the coating film of the curable composition 101, thus forming a coating film 106 in the micro- and/or nano-pattern on the mold 104 (FIG. 2B(b-2)).

Considering the next step (photoirradiation step), the mold 104 is made of a light-transmitting material. More specifically, the mold 104 can be made of glass, quartz, a transparent resin, such as PMMA or polycarbonate, a transparent metal deposited film, a flexible film, such as a polydimethylsiloxane film, a photo-cured film, or a metal film. When the mold 104 is made of a transparent resin, the transparent resin should not be dissolved in the components of the curable composition 101. Quartz is preferable for the mold 104 because of a low thermal expansion coefficient and low pattern distortion.

The micro- and nano-pattern on the surface of the mold 104 can have a pattern height of 4 nm or more and 200 nm or less and an aspect ratio of 1 or more and 10 or less.

In order to improve the detachability of the curable composition 101 from the surface of the mold 104, the mold 104 may be subjected to surface treatment before the present step of bringing the curable composition into contact with the mold. The surface treatment may be performed by applying a release agent to the surface of the mold to form a release agent layer. The release agent to be applied to the surface of the mold may be a silicone release agent, a fluorinated release agent, a hydrocarbon release agent, a polyethylene release agent, a polypropylene release agent, a paraffinic release agent, a montan release agent, or a carnauba release agent. For example, a commercially available coating type release agent, such as Optool DSX manufactured by Daikin Industries, Ltd., may be used. These release agents may be used alone or in combination of two or more thereof. Among these, a fluorinated release agent and/or a hydrocarbon release agent may be used.

In the present step (mold contact step), as illustrated in FIG. 2B(b-1), when the mold 104 is brought into contact with the curable composition 101, the pressure applied to the curable composition 101 is not particularly limited and is generally 0 MPa or more and 100 MPa or less, preferably 0 MPa or more and 50 MPa or less, more preferably 0 MPa or more and 30 MPa or less, still more preferably 0 MPa or more and 20 MPa or less.

In the present step, the contact time between the mold 104 and the curable composition 101 is not particularly limited and is generally 0.1 seconds or more and 600 seconds or less, preferably 0.1 seconds or more and 300 seconds or less, more preferably 0.1 seconds or more and 180 seconds or less, still more preferably 0.1 seconds or more and 120 seconds or less.

The present step may be performed in the ambient atmosphere, under reduced pressure, or in an inert gas atmosphere. The effects of oxygen and moisture on the curing reaction can be suppressed under reduced pressure or in an inert gas atmosphere. When the present step is performed in an inert gas atmosphere, the inert gas may be nitrogen, carbon dioxide, helium, argon, a flon, the alternative thereof, or a mixture thereof. When the present step is performed in the ambient atmosphere or in a particular gas atmosphere, the pressure is 0.0001 atm or more and 10 atm or less.

The mold contact step may be performed in an atmosphere containing a condensable gas (hereinafter referred to as a condensable gas atmosphere). The term "condensable gas", as used herein, refers to a gas that is in gaseous form in the atmosphere before the contact between the curable composition 101 (a layer to which a pattern is to be transferred) and the mold 104 in the mold contact step (FIG. 2B(b-1)) and is condensed and liquefied under capillary pressure resulting from filling pressure when the recessed portions of the micro- and/or nano-pattern on the mold 104 and a gap between the mold 104 and the substrate 102 are filled with the gas in the atmosphere together with (part of) the coating film 106 upon contact between the curable composition 101 (a layer to which a pattern is to be transferred) and the mold 104.

In the mold contact step in a condensable gas atmosphere, the gas in the recessed portions of the micro- and/or nano-pattern is liquefied, and gas bubbles disappear, which improves the filling property. The condensable gas may be dissolved in the curable composition.

The boiling point of the condensable gas is below the ambient temperature of the mold contact step and preferably ranges from −10° C. to 23° C. more preferably 10° C. to 23° C. A boiling point in this range results in further improved filling property.

The vapor pressure of the condensable gas at the ambient temperature in the mold contact step is below the mold pressure applied in the mold contact step and preferably ranges from 0.1 to 0.4 MPa. A vapor pressure in this range results in further improved filling property. A vapor pressure of more than 0.4 MPa at the ambient temperature tends to result in insufficient effects of disappeared gas bubbles. On the other hand, a vapor pressure of less than 0.1 MPa at the ambient temperature required pressure reduction, which tends to make the apparatus complex.

The ambient temperature in the mold contact step is not particularly limited and preferably ranges from 20° C. to 25° C.

The condensable gas may be a flon or the alternative thereof, for example, chlorofluorocarbon (CFC), such as trichlorofluoromethane, fluorocarbon (FC), hydrochlorofluorocarbon (HCFC), hydrofluorocarbon (HFC), such as 1,1,1,3,3-pentafluoropropane ($CHF_2CH_2CF_3$, HFC-245fa, PFP), or hydrofluoroether (HFE), such as pentafluoroethyl methyl ether ($CF_3CF_2OCH_3$, HFE-245mc).

Among these, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether have good filling properties at an ambient temperature in the range of 20° C. to 25° C. in the mold contact step. In particular, 1,1,1,3,3-pentafluoropropane has improved safety.

These condensable gases may be used alone or in combination of two or more thereof. The condensable gas may be used in combination with a noncondensable gas, such as air, nitrogen, carbon dioxide, helium, and/or argon. The noncondensable gas to be mixed with the condensable gas may be helium in terms of filling property. In this case, when the recessed portions of the micro- and/or nano-pattern on the mold 104 are filled with the gases in the atmosphere (the condensable gas and helium) together with (part of) the coating film 106 in the mold contact step, upon liquefaction of the condensable gas, helium can pass through the mold, thus improving the filling property.

<Aligning Step [3]>

As illustrated in FIG. 2C, the positions of the mold and/or the workpiece substrate are adjusted such that a mold positioning mark 105 is aligned with a workpiece substrate positioning mark 103.

<Photoirradiation Step [4]>

As illustrated in FIG. 2D, after aligning in the step [3], a contact portion between the curable composition 101 and the mold 104, more specifically, the coating film 106 in the micro- and/or nano-pattern on the mold 104 is irradiated with light through the mold 104 (FIG. 2D(d-1)). The coating film 106 in the micro- and/or nano-pattern on the mold 104 is cured by photoirradiation and forms a cured film 108 (FIG. 2D(d-2)).

The type of light irradiated to the curable composition 101 of the coating film 106 in the micro- and/or nano-pattern on the mold 104 depends on the sensitive wavelength of the curable composition 101. More specifically, the light may be ultraviolet light having a wavelength of 150 nm or more and 400 nm or less, X-rays, or an electron beam.

Among these, the light irradiated to the curable composition 101 (irradiation light 107) may be ultraviolet light. This is because many commercially available curing aids (photopolymerization initiators) are sensitive to ultraviolet light. Examples of ultraviolet light sources include, but are not limited to, high-pressure mercury lamps, ultra-high-pressure mercury lamps, low-pressure mercury lamps, deep-UV lamps, carbon are lamps, chemical lamps, metal halide lamps, xenon lamps, KrF excimer lasers, ArF excimer lasers, and $F_2$ excimer lasers. In particular, an ultra-high-pressure mercury lamp may be used as an ultraviolet light source in the present embodiment. The number of light sources to be used may be one or two or more. The coating film 106 in the micro- and/or nano-pattern on the mold 104 may be entirely or partly irradiated with light.

The entire substrate 102 may be intermittently or continuously irradiated with light. A region A may be irradiated with light in a first irradiation process, and another region B may be irradiated with light in a second irradiation process.

In the present embodiment, the exposure dose of the curable composition 101 in the present step is preferably 90 mJ/cm$^2$ or less, more preferably a low exposure dose, most preferably 30 mJ/cm$^2$ or less. The term "a low exposure dose", as used herein, refers to 76 mJ/cm$^2$ or less.

In this case, a cured product of the curable composition according to the present embodiment satisfies the following formula (1) and can satisfy the following formula (2).

$$Er_1/Er_2 \geq 1.10 \tag{1}$$

$Er_1$ denotes the surface reduced modulus (GPa) of a cured product of the curable composition, and $Er_2$ denotes the internal reduced modulus (GPa) of the cured product.

$$Er_3/Er_2 \geq 1.40 \tag{2}$$

$Er_1$ and $Er_2$ in the formula (2) are the same as $Er_1$ and $Er_2$ in the formula (1) and denote the surface reduced modulus (GPa) and the internal reduced modulus (GPa) of the cured product, respectively.

The curable composition can also satisfy the following formula (3) as well as the formula (1) or (2) in a cured state.

$$Er_1 \geq 3.00 \text{ GPa} \tag{3}$$

The curable composition can also satisfy the formula (4) in a cured state.

$$Er_1 \geq 3.50 \text{ GPa} \tag{4}$$

$Er_1$ in the formulae (3) and (4) is the same as $Er_1$ in the formula (1) or (2) and denotes the surface reduced modulus (GPa) of the cured product.

Thus, a cured product that has a sufficiently cured surface and is less prone to a pattern collapse defect can be formed even when the curable composition is cured at a low exposure dose.

<Demolding Step [5]>

The cured product 108 is then separated from the mold 104. A cured product 109 having a predetermined pattern is formed on the substrate 102.

In the present step (demolding step), as illustrated in FIG. 2E, the cured product 108 is separated from the mold 104, and the resulting cured product 109 has a reverse pattern of the micro- and/or nano-pattern of the mold 104 formed in the step [4] (photoirradiation step).

When the mold contact step is performed in a condensable gas atmosphere, as the pressure at the interface between the cured product 108 and the mold 104 is decreased by the separation of the cured product 108 from the mold 104 in the demolding step, the condensable gas is vaporized and tends to effectively decrease the demolding force.

The cured product 108 may be separated from the mold 104 by any method under any conditions, provided that the cured product 108 is not physically damaged. For example, the substrate 102 (workpiece substrate) may be separated from the mold 104 by fixing the substrate 102 and moving the mold 104 away from the substrate 102, or by fixing the mold 104 and moving the substrate 102 away from the mold 104, or by moving the substrate 102 and the mold 104 in opposite directions.

A cured product having a desired uneven pattern (a pattern resulting from the uneven surface profile of the mold 104) at a desired position can be produced through the series of steps [1] to [5] (production process). The cured product can also be used as an optical member, such as a Fresnel lens or a diffraction grating (or part of an optical member). In such a case, the optical member can include the substrate 102 and the patterned cured product 109 disposed on the substrate 102.

In a method for producing a patterned cured product according to the present embodiment, a repeating unit (shot) composed of the steps [1] to [5] can be performed multiple times on a single workpiece substrate. The repeating unit (shot) composed of the steps [1] to [5] can be performed multiple times to form a cured product having a plurality of desired uneven patterns (a pattern resulting from the uneven surface profile of the mold 104) at a desired position on the workpiece substrate.

<Residual Film Removal Step [6] of Removing Part of Cured Product>

Although a cured product produced in the demolding step [5] has a particular pattern, part of the cured product may remain in a region other than the patterned region (such part of the cured product is hereinafter also referred to as a residual film). In such a case, as illustrated in FIG. 2F, a portion of the patterned cured product in a region to be removed (a residual film) can be removed to form a cured product pattern 110 having a desired uneven pattern (a pattern resulting from the uneven surface profile of the mold 104).

The residual film may be removed by etching a cured product (residual film) in the recessed portions of the cured product 109 and thereby exposing the surface of the substrate 102 in the recessed portions of the pattern of the cured product 109.

The cured product in the recessed portions of the cured product 109 may be etched by any method, for example, a conventional method, such as dry etching. A known dry etching apparatus may be used in dry etching. The source gas for dry etching depends on the elementary composition of a cured product to be etched and may be a halogen gas, such as $CF_4$, $C_2F_6$, $C_3F_8$, $CCl_2F_2$, $CCl_1$, $CBrF_3$, $BCl_3$, $PCl_3$, $SF_6$, or $Cl_2$, a gas containing an oxygen atom, such as $O_2$, CO, or $CO_2$, an inert gas, such as He, $N_2$, or Ar, $H_2$, or $NH_3$. These gases may be used as a mixture thereof.

The cured product pattern 110 having a desired uneven pattern (a pattern resulting from the uneven surface profile of the mold 104) at a desired position can be produced through the production process including the steps [1] to [6]. An article having the cured product pattern can also be produced. When the substrate 102 is processed utilizing the cured product pattern 110, a substrate processing step (step [7]) is performed as described below.

The cured product pattern 110 can be used as an optical member, such as a diffraction grating or polarizer, (or part of an optical member) to produce an optical component. In such a case, the optical component can include the substrate 102 and the cured product pattern 110 disposed on the substrate 102.

<Substrate Processing Step [7]>

The cured product pattern 110 having an uneven pattern produced by a method for producing a patterned cured product according to the present embodiment can be used as a film for use in interlayer insulating films of electronic components exemplified by semiconductor devices, such as LSI, system LSI, DRAM, SDRAM, RDRAM, and D-RDRAM, and can also be used as a resist film in the manufacture of semiconductor devices.

When the cured product pattern 110 is used as a resist film, an exposed surface of the substrate in the etching step [6] (a region 111 in FIG. 2F) is subjected to etching or ion implantation. The cured product pattern 110 functions as an etching mask. Furthermore, a circuit structure 112 based on the pattern of the cured product pattern 110 (FIG. 2G) can be formed on the substrate 102 by forming an electronic component. Thus, a circuit board for use in semiconductor devices can be manufactured. This circuit board can be coupled to a circuit control mechanism for the circuit board to form electronic equipment, such as displays, cameras, and medical devices.

Likewise, an optical component can be manufactured by etching or ion implantation using the cured product pattern 110 as a resist film.

In the manufacture of circuitized substrates and electronic components, the cured product pattern 110 may be finally removed from the processed substrate or may be left as a member of the device.

EXEMPLARY EMBODIMENTS

The present invention will be further described with the following exemplary embodiments. However, the technical scope of the present invention is not limited to these exemplary embodiments.

Comparative Example 1

(1) Preparation of Curable Composition (b-1)

A blend of the following components (A) and (B) was passed through a 0.2 μm ultra-high molecular weight polyethylene filter to prepare a curable composition (b-1) according to Comparative Example 1.

(1-1) Component (A): 94 parts by weight in total
<A-1> Isobornyl acrylate (manufactured by Kyoeisha Chemical Co., Ltd., trade name: IB-XA): 9.0 parts by weight
<A-2> Benzyl acrylate (manufactured by Osaka Organic Chemical Industry Ltd., trade name: V#160): 38.0 parts by weight
<A-3> Neopentyl glycol diacrylate (manufactured by Kyoeisha Chemical Co., Ltd., trade name: NP-A): 47.0 parts by weight (1-2) Component (B): 3 parts by weight in total
<B-1> Irgacure 651 (manufactured by BASF): 3 parts by weight

[Chem. 10]

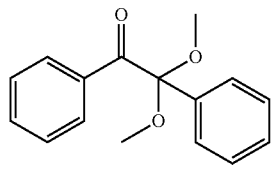

Formula (a)

(2) Preparation of Cured Product of Curable Composition

2 μL of the curable composition (b-1) was dropped on a silicon wafer on which an adhesion-promoting layer having a thickness of 60 nm was formed as an adhesion layer. The silicon wafer was covered with a quartz glass sheet having a thickness of 1 mm, thereby filling a 25 mm×25 mm region with the curable composition (b-1).

The coating film was then irradiated for 200 seconds with light irradiated from a UV light source equipped with an ultra-high-pressure mercury lamp through an interference filter described below and through the quartz glass sheet. The interference filter used for the photoirradiation was VPF-25C-10-15-31300 (manufactured by Sigmakoki Co., Ltd.). The irradiation light was single-wavelength ultraviolet light having a wavelength in the range of 308 to 318 nm. The illuminance was 1 mW/cm².

After the photoirradiation, the quartz glass sheet was removed. A cured product (b-1-200) of the curable composition (b-1) cured at an exposure dose of 200 mJ/cm² was formed on the silicon wafer. The cured product (b-1-200) had an average film thickness of 3.2 m.

(3) Measurement of Reduced Modulus of Cured Product

The reduced modulus of the cured product (b-1-200) was measured with a nanoindenter apparatus (TI-950 TriboIndenter, manufactured by Hysitron Corporation) 24 hours after curing. In the present specification, the reduced modulus was measured with the nanoindenter apparatus equipped with a diamond indenter (TI-0037, 90-degree cube corner type, manufactured by Hysitron Corporation), which was calibrated using fused quartz as a standard sample.

The surface reduced modulus $Er_1$ (GPa) of the cured product was determined by measuring the load (P) and displacement (indentation depth h) while the surface was indented with the diamond indenter to an indentation depth of approximately 10 nm, determining the slope $P^{2/3}/h$ in a region in which a "$P^{2/3}$ vs. h" line was substantially straight (immediately after loading, at an indentation depth in the range of 0 to 4 nm) by the Hertz method, substituting the slope $P^{2/3}/h$ into the following mathematical formula (1) to determine an average reduced modulus in a depth range of 4 nm or less from the surface of the cured product, and averaging average reduced moduli measured in this manner at 15 points. In the mathematical formula (1), R denotes the tip radius of the indenter used for the measurement. The indenter tip radius R was determined using this formula from nanoindentation of fused quartz with the used indenter.

[Math. 3]

$$Er_1 = \frac{3}{4}\left(\frac{1}{R^{1/2}} \frac{P}{h^{3/2}}\right) \quad \text{Formula (1)}$$

The internal reduced modulus $Er_2$ (GPa) of the cured product was determined by measuring the load (P) and displacement (indentation depth h) while the surface of the cured product was indented with the diamond indenter to an indentation depth of 200 nm, substituting the slope S of a tangent line of the "P vs. h" curve immediately after unloading into the following mathematical formula (2) by the Oliver-Pharr method to determine the reduced modulus at a depth of 200 nm from the surface of the cured product, and averaging reduced moduli measured in this manner at 15 points. In the mathematical formula (2), $A_c$ denotes the contact projected area, which depends on the indenter used for the measurement and the indentation depth. The contact projected area $A_c$ was determined from a calibration curve (the relationship between the indentation depth and the contact projected area of the used indenter) obtained using this formula from nanoindentation of fused quartz with the used indenter.

[Math. 4]

$$Er_2 = \frac{S\sqrt{\pi}}{2\sqrt{A_c}} \quad \text{Formula (2)}$$

The surface reduced modulus $Er_1$ of the cured product (b-1-200) was 3.39 GPa. The internal reduced modulus $Er_2$ of the cured product (b-1-200) was 3.21 GPa. $Er_1/Er_2$ was 1.06.

(4) Observation of Nanoimprint Pattern

A nanoimprint pattern of the curable composition (b-1) was formed by the following method and was observed with an electron microscope.

(4-1) Placement Step 1440 droplets (11 pL/droplet) of the curable composition (b-1) were dropped by an ink jet method on a 300-mm silicon wafer on which an adhesion-promoting layer having a thickness of 3 nm was formed as an adhesion layer. These droplets were disposed at substantially regular intervals in a region 26 mm in length and 33 mm in width.

(4-2) Mold Contact Step and Photoirradiation Step

A 28-nm line and space (L/S) pattern having a height of 60 nm was formed on the curable composition (b-1) on the silicon wafer and was brought into contact with a quartz mold (26 mm in length and 33 mm in width) not subjected to surface treatment.

30 seconds after the contact with the quartz mold, the curable composition (b-1) was irradiated with UV light emitted from a UV light source equipped with a 200-W mercury-xenon lamp (EXECURE 3000, manufactured by HOYA CANDEO OPTRONICS CORPORATION) through the quartz mold. During the UV light irradiation, an interference filter that can selectively transmit light having a wavelength in the range of 308 to 318 nm (VPF-50C-10-25-31300, manufactured by Sigmakoki Co., Ltd.) was placed between the UV light source and the quartz mold. The illuminance of the UV light directly under the quartz mold was 40 mW/cm² at a wavelength of 313 nm. UV light irradiation under such conditions was performed for 0.25 to 5.00 seconds (exposure dose: 10 to 189 mJ/cm²).

(4-3) Demolding Step

The quartz mold was raised at 0.5 mm/s to separate the mold from the cured product.

[Chem. 12]

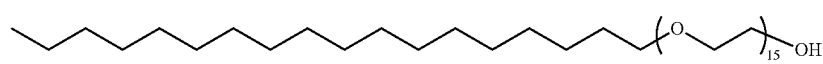

Formula (d)

(4-4) Observation of Nanoimprint Pattern with Electron Microscope

Observation of a 6.75 μm×6.75 μm area of a nanoimprint pattern with an electron microscope showed that there was a defect, such as pattern collapse, at a low exposure dose of 76 mJ/cm² or less.

The minimum exposure dose required for the curable composition (b-1) to form a satisfactory pattern free of pattern collapse and other defects was 90 mJ/cm² or more.

The pattern collapse means that at least part of adjacent lines of the 28-nm line and space (L/S) pattern having a height of 60 nm are in contact.

Exemplary Embodiment 1

(1) Preparation of Curable Composition (a-1)

A curable composition (a-1) was prepared in the same manner as in Comparative Example 1 except that 1.1 parts by weight of <C-1> TF-2067 (manufactured by DIC Corporation) represented by the following formula (c) was used as an additive component (C) in addition to the components (A) and (B).

[Chem. 11]

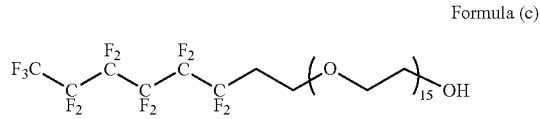

Formula (c)

(2) Preparation of Cured Product of Curable Composition

In the same manner as in Comparative Example 1, a film of the curable composition (a-1) having a thickness of 3.2 μm on a silicon wafer was cured at an exposure dose of 200 mJ/cm² to form a cured product (a-1-200).

(3) Measurement of Reduced Modulus of Cured Product

The reduced modulus of the cured product (a-1-200) was measured in the same manner as in Comparative Example 1. The surface reduced modulus $Er_1$ and the internal reduced modulus $Er_2$ of the cured product (a-1-200) were 4.33 and 2.87 GPa, respectively, and $Er_1/Er_2$ was 1.51.

(4) Observation of Nanoimprint Pattern

A nanoimprint pattern of the curable composition (a-1) was formed in the same manner as in Comparative Example 1 and was observed with an electron microscope. The observation showed that a satisfactory pattern free of pattern collapse and other defects was formed even at a low exposure dose in the range of 19 to 76 mJ/cm².

Exemplary Embodiment 2

(1) Preparation of Curable Composition (a-2)

A curable composition (a-2) was prepared in the same manner as in Comparative Example 1 except that 0.9 parts by weight of <C-2> SR-715 (manufactured by Aoki Oil Industrial Co., Ltd.) represented by the following formula (d) was used as an additive component (C) in addition to the components (A) and (B).

(2) Preparation of Cured Product of Curable Composition

In the same manner as in Comparative Example 1, a film of the curable composition (a-2) having a thickness of 3.2 μm on a silicon wafer was cured at an exposure dose of 200 mJ/cm² to form a cured product (a-2-200).

(3) Measurement of Reduced Modulus of Cured Product

The reduced modulus of the cured product (a-2-200) was measured in the same manner as in Comparative Example 1. The surface reduced modulus $Er_1$ and the internal reduced modulus $Er_2$ of the cured product (a-2-200) were 5.10 and 2.90 GPa, respectively, and $Er_1/Er_2$ was 1.76.

(4) Observation of Nanoimprint Pattern

A nanoimprint pattern of the curable composition (a-2) was formed in the same manner as in Comparative Example

Comparative Example 2

(1) Preparation of Curable Composition (b-2)

A curable composition (b-2) was prepared in the same manner as in Comparative Example 1 except that 0.8 parts by weight of <C-3> Pluriol A760E (manufactured by BASF) represented by the following formula (e) was used as an additive component (C) in addition to the components (A) and (B).

[Chem. 13]

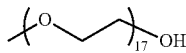

Formula (e)

(2) Preparation of Cured Product of Curable Composition

In the same manner as in Comparative Example 1, a film of the curable composition (b-2) having a thickness of 3.2 µm on a silicon wafer was cured at an exposure dose of 200 mJ/cm² to form a cured product (b-2-200).

(3) Measurement of Reduced Modulus of Cured Product

The reduced modulus of the cured product (b-2-200) was measured in the same manner as in Comparative Example 1. The surface reduced modulus $Er_1$ and the internal reduced modulus $Er_2$ of the cured product (b-2-200) were 2.90 and 3.04 GPa, respectively, and $Er_1/Er_2$ was 0.953.

(4) Observation of Nanoimprint Pattern

A nanoimprint pattern of the curable composition (b-2) was formed in the same manner as in Comparative Example 1 and was observed with an electron microscope. The observation showed that there was a defect, such as pattern collapse, at a low exposure dose of 76 mJ/cm² or less.

The minimum exposure dose required for the curable composition (b-2) to form a satisfactory pattern free of pattern collapse and other defects was 90 mJ/cm² or more.

Exemplary Embodiment 3

(1) Preparation of Curable Composition (a-3)

A curable composition (a-3) was prepared in the same manner as in Comparative Example 1 except that the component (B) was 3 parts by weight of <B-2> Irgacure 369 (manufactured by BASF) represented by the following formula (b).

[Chem. 14]

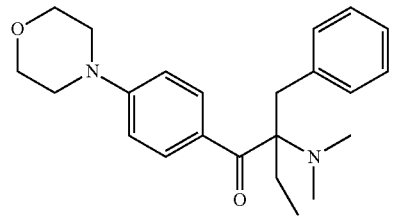

Formula (b)

(2) Preparation of Cured Product of Curable Composition

In the same manner as in Comparative Example 1, a film of the curable composition (a-3) having a thickness of 3.2 µm on a silicon wafer was cured at an exposure dose of 200 mJ/cm² to form a cured product (a-3-200).

(3) Measurement of Reduced Modulus of Cured Product

The reduced modulus of the cured product (a-3-200) was measured in the same manner as in Comparative Example 1. The surface reduced modulus $Er_1$ and the internal reduced modulus $Er_2$ of the cured product (a-3-200) were 5.75 and 3.51 GPa, respectively, and $Er_1/Er_2$ was 1.64.

(4) Observation of Nanoimprint Pattern

A nanoimprint pattern of the curable composition (a-3) was formed in the same manner as in Comparative Example 1 and was observed with an electron microscope. The observation showed that a satisfactory pattern free of pattern collapse and other defects was formed even at a low exposure dose in the range of 10 to 76 mJ/cm².

Exemplary Embodiment 4

(1) Preparation of Curable Composition (a-4)

A blend of the following component (A), component (B), and additive component (C) was passed through a 0.2 µm ultra-high molecular weight polyethylene filter to prepare a curable composition (a-4).

(1-1) Component (A): 100 parts by weight in total

<A-2> Benzyl acrylate (manufactured by Osaka Organic Chemical Industry Ltd., trade name: V#160): 50 parts by weight <A-4> m-xylylene diacrylate: 50 parts by weight (1-2) Component (B): 3 parts by weight in total <B-3> Lucirin TPO (manufactured by BASF): 3 parts by weight (1-3) Additive component (C) other than components (A) and (B): 1.3 parts by weight in total <C-4> Polyoxyethylene stearyl ether Emulgen 320P (manufactured by Kao Corporation): 0.8 parts by weight <C-5> 4,4'-bis(diethylamino)benzophenone (manufactured by Tokyo Chemical Industry Co., Ltd.): 0.5 parts by weight

[Chem. 15]

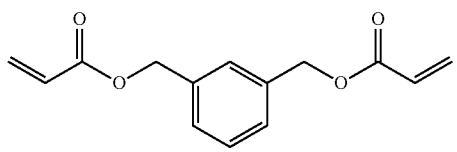

Formula (j)

[Chem. 16]

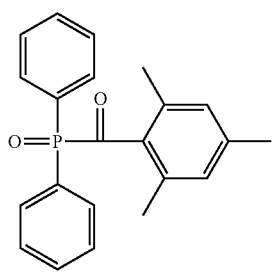

Formula (f)

[Chem. 17]

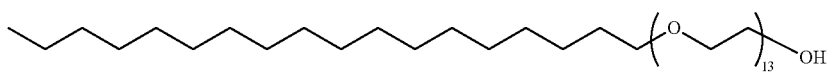

Formula (h)

[Chem. 18]

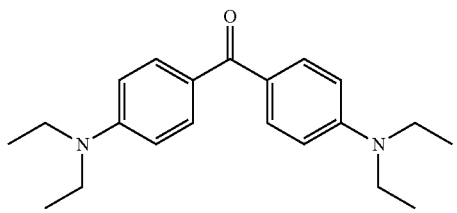

Formula (g)

(2) Preparation of Cured Product of Curable Composition

In the same manner as in Comparative Example 1, a film of the curable composition (a-4) having a thickness of 3.2 m on a silicon wafer was cured at an exposure dose of 200 mJ/cm$^2$ to form a cured product (a-4-200).

(3) Measurement of Reduced Modulus of Cured Product

The reduced modulus of the cured product (a-4-200) was measured in the same manner as in Comparative Example 1. The surface reduced modulus $Er_1$ and the internal reduced modulus $Er_2$ of the cured product (a-4-200) were 5.90 and 4.04 GPa, respectively, and $Er_1/Er_2$ was 1.46.

(4) Observation of Nanoimprint Pattern

It is assumed from the measurement of the reduced modulus of the cured product (a-4-200) that a satisfactory nanoimprint pattern of the curable composition (a-4) free of pattern collapse and other defects can be formed in the same manner as in Comparative Example 1 even at a low exposure dose in the range of 10 to 76 mJ/cm$^2$.

Exemplary Embodiment 5

(1) Preparation of Curable Composition (a-5)

A curable composition (a-5) was prepared in the same manner as in Exemplary Embodiment 4 except that the component (A) was composed of 45 parts by weight of <A-2> benzyl acrylate (manufactured by Osaka Organic Chemical Industry Ltd., trade name: V#160), 50 parts by weight of <A-4> m-xylylene diacrylate, and 5 parts by weight of <A-5> 2-naphthylmethyl acrylate.

[Chem. 19]

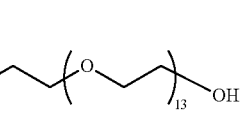

Formula (j)

[Chem. 20]

Formula (k)

(2) Preparation of Cured Film of Curable Composition

In the same manner as in Comparative Example 1, a film of the curable composition (a-5) having a thickness of 3.2 μm on a silicon wafer was exposed to light at 200 mJ/cm$^2$ to form a cured film (a-5-200).

(3) Measurement of Reduced Modulus of Cured Product

The reduced modulus of the cured product (a-5-200) was measured in the same manner as in Comparative Example 1. The surface reduced modulus $Er_1$ and the internal reduced modulus $Er_2$ of the cured product (a-5-200) were 6.02 and 4.00 GPa, respectively, and $Er_1/Er_2$ was 1.51.

(4) Observation of Nanoimprint Pattern

It is assumed from the measurement of the reduced modulus of the cured product (a-5-200) that a satisfactory nanoimprint pattern of the curable composition (a-5) free of pattern collapse and other defects can be formed in the same manner as in Comparative Example 1 even at a low exposure dose in the range of 10 to 76 mJ/cm$^2$.

Exemplary Embodiment 6

(1) Preparation of Curable Composition (a-6)

[Chem. 22]

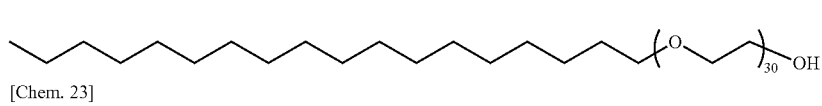

Formula (i)

[Chem. 23]

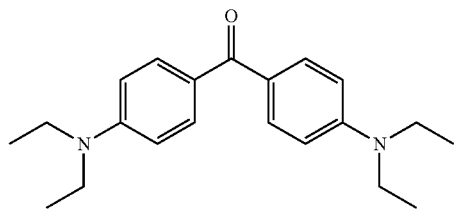

Formula (g)

A curable composition (a-6) was prepared in the same manner as in Exemplary Embodiment 4 except that the component (A) was composed of 50 parts by weight of <A-2> benzyl acrylate (manufactured by Osaka Organic Chemical Industry Ltd., trade name: V#160) and 50 parts by weight of <A-7> phenylethylene glycol diacrylate.

[Chem. 21]

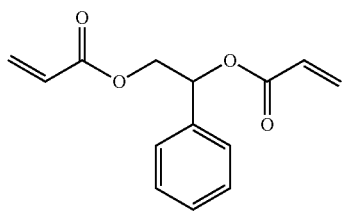

Formula (l)

(2) Preparation of Cured Film of Curable Composition

In the same manner as in Comparative Example 1, a film of the curable composition (a-6) having a thickness of 3.2 μm on a silicon wafer was exposed to light at 200 mJ/cm² to form a cured film (a-6-200).

(3) Measurement of Reduced Modulus of Cured Product

The reduced modulus of the cured product (a-6-200) was measured in the same manner as in Comparative Example 1. The surface reduced modulus $Er_1$ and the internal reduced modulus $Er_2$ of the cured product (a-6-200) were 4.20 and 3.76 GPa, respectively, and $Er_1/Er_2$ was 1.12.

(4) Observation of Nanoimprint Pattern

It is assumed from the measurement of the reduced modulus of the cured product (a-6-200) that a satisfactory nanoimprint pattern of the curable composition (a-6) free of pattern collapse and other defects can be formed in the same manner as in Comparative Example 1 even at a low exposure dose in the range of 10 to 76 mJ/cm².

Exemplary Embodiment 7

(1) Preparation of Curable Composition (a-7)

A curable composition (a-7) was prepared in the same manner as in Exemplary Embodiment 6 except that the additive component (C) was composed of 1.6 parts by weight of <C-6> polyoxyethylene stearyl ether SR-730 (manufactured by Aoki Oil Industrial Co., Ltd.) and 0.5 parts by weight of <C-5> 4,4'-bis(diethylamino)benzophenone (manufactured by Tokyo Chemical Industry Co., Ltd.).

(2) Preparation of Cured Film of Curable Composition

In the same manner as in Comparative Example 1, a film of the curable composition (a-7) having a thickness of 3.2 m on a silicon wafer was exposed to light at 200 mJ/cm² to form a cured film (a-7-200).

(3) Measurement of Reduced Modulus of Cured Product

The reduced modulus of the cured product (a-7-200) was measured in the same manner as in Comparative Example 1. The surface reduced modulus $Er_1$ and the internal reduced modulus $Er_2$ of the cured product (a-7-200) were 4.60 and 3.84 GPa, respectively, and $Er_1/Er_2$ was 1.20.

(4) Observation of Nanoimprint Pattern

It is assumed from the measurement of the reduced modulus of the cured product (a-7-200) that a satisfactory nanoimprint pattern of the curable composition (a-7) free of pattern collapse and other defects can be formed in the same manner as in Comparative Example 1 even at a low exposure dose in the range of 10 to 76 mJ/cm².

Comparative Example 3

(1) Preparation of Curable Composition (b-3)

A blend of the following components (A) and (B) was passed through a 0.2 μm ultra-high molecular weight polyethylene filter to prepare a curable composition (b-3).

(1-1) Component (A): 100 parts by weight in total
<A-2> Benzyl acrylate (manufactured by Osaka Organic Chemical Industry Ltd., trade name: V#160): 50 parts by weight
<A-7> Phenylethylene glycol diacrylate: 50 parts by weight
(1-2) Component (B): 3 parts by weight in total
<B-3> Lucirin TPO (manufactured by BASF): 3 parts by weight

[Chem. 24]

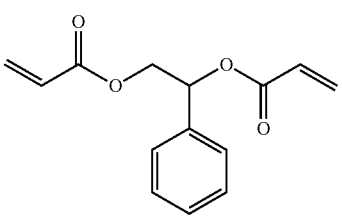

Formula (l)

-continued

[Chem. 25]

Formula (f)

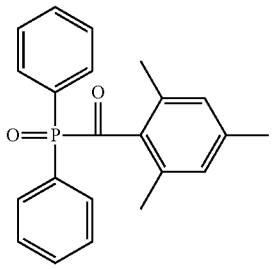

(2) Preparation of Cured Product of Curable Composition

In the same manner as in Comparative Example 1, a film of the curable composition (b-3) having a thickness of 3.2 μm on a silicon wafer was cured at an exposure dose of 200 mJ/cm² to form a cured product (b-3-200).

(3) Measurement of Reduced Modulus of Cured Product

The reduced modulus of the cured product (b-3-200) was measured in the same manner as in Comparative Example 1. The surface reduced modulus $Er_1$ and the internal reduced modulus $Er_2$ of the cured product (b-3-200) were 3.54 and 3.87 GPa, respectively, and $Er_1/Er_2$ was 0.915.

(4) Observation of Nanoimprint Pattern

It is assumed from the measurement of the reduced modulus of the cured product (b-3-200) that a nanoimprint pattern of the curable composition (b-3) formed in the same manner as in Comparative Example 1 will have a defect, such as pattern collapse, at a low exposure dose of 76 mJ/cm² or less.

Exemplary Embodiment 8

(1) Preparation of Curable Composition (a-8)

A curable composition (a-8) was prepared in the same manner as in Comparative Example 1 except that the component (B) was 3 parts by weight of <B-3> Lucirin TPO (manufactured by BASF) represented by the following formula (f).

[Chem. 26]

Formula (f)

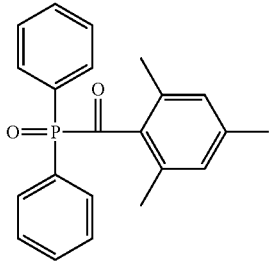

(2) Preparation of Cured Product of Curable Composition

In the same manner as in Comparative Example 1, a film of the curable composition (a-8) having a thickness of 3.2 μm on a silicon wafer was cured at an exposure dose of 200 mJ/cm² to form a cured product (a-8-200).

(3) Measurement of Reduced Modulus of Cured Product

The reduced modulus of the cured product (a-8-200) was measured in the same manner as in Comparative Example 1. The surface reduced modulus $Er_1$ and the internal reduced modulus $Er_2$ of the cured product (a-8-200) were 5.12 and 3.64 GPa, respectively, and $Er_1/Er_2$ was 1.41.

(4) Observation of Nanoimprint Pattern

It is assumed from the measurement of the reduced modulus of the cured product (a-8-200) that a satisfactory nanoimprint pattern of the curable composition (a-8) free of pattern collapse and other defects can be formed in the same manner as in Comparative Example 1 even at a low exposure dose in the range of 10 to 76 mJ/cm².

Exemplary Embodiment 9

(1) Preparation of Curable Composition (a-9)

A blend of the following components (A) and (B) was passed through a 0.2 μm ultra-high molecular weight polyethylene filter to prepare a curable composition (a-9).

(1-1) Component (A): 100 parts by weight in total

<A-8> Dicyclopentanyl acrylate (manufactured by Hitachi Chemical Co., Ltd., trade name: FA-513AS): 50 parts by weight <A-4> m-xylylene diacrylate: 50 parts by weight (1-2) Component (B): 3 parts by weight in total <B-2> Irgacure 369 (manufactured by BASF): 3 parts by weight

[Chem. 27]

Formula (j)

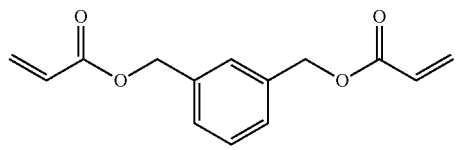

[Chem. 28]

Formula (b)

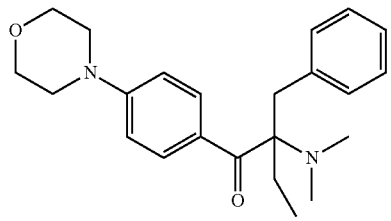

(2) Preparation of Cured Product of Curable Composition

In the same manner as in Comparative Example 1, a film of the curable composition (a-9) having a thickness of 3.2 m on a silicon wafer was cured at an exposure dose of 200 mJ/cm² to form a cured product (a-9-200).

(3) Measurement of Reduced Modulus of Cured Product

The reduced modulus of the cured product (a-9-200) was measured in the same manner as in Comparative Example 1. The surface reduced modulus $Er_1$ and the internal reduced modulus $Er_2$ of the cured product (a-9-200) were 5.57 and 3.47 GPa, respectively, and $Er_1/Er_2$ was 1.61.

(4) Observation of Nanoimprint Pattern

It is assumed from the measurement of the reduced modulus of the cured product (a-9-200) that a satisfactory nanoimprint pattern of the curable composition (a-9) free of pattern collapse and other defects can be formed in the same manner as in Comparative Example 1 even at a low exposure dose in the range of 10 to 76 mJ/cm².

Exemplary Embodiment 10

(1) Preparation of Curable Composition (a-10)

A blend of the following component (A), component (B), and additive component (C) was passed through a 0.2 μm ultra-high molecular weight polyethylene filter to prepare a curable composition (a-10).

(1-1) Component (A): 100 parts by weight in total

<A-1> Isobornyl acrylate (manufactured by Kyoeisha Chemical Co., td., trade name: IB-XA): 75 parts by weight <A-9> 1,10-decanediol diacrylate (manufactured by Shin Nakamura Chemical Co., Ltd., trade name: A-DOD-N): 25 parts by weight (1-2) Component (B): 3 parts by weight in total <B-3> Lucirin TPO (manufactured by BASF): 3 parts by weight (1-3) Additive component (C) other than components (A) and (B): 0.5 parts by weight in total <C-5> 4,4'-bis(diethylamino)benzophenone (manufactured by Tokyo Chemical Industry Co., Ltd.): 0.5 parts by weight

[Chem. 29]

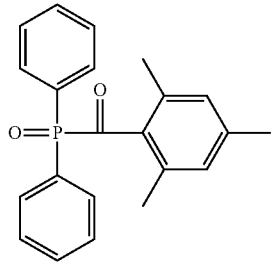

Formula (f)

[Chem. 30]

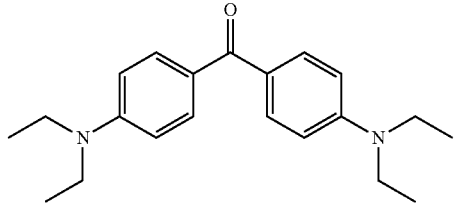

Formula (g)

(2) Preparation of Cured Product of Curable Composition

In the same manner as in Comparative Example 1, a film of the curable composition (a-10) having a thickness of 3.2 μm on a silicon wafer was cured at an exposure dose of 200 mJ/cm$^2$ to form a cured product (a-10-200).

(3) Measurement of Reduced Modulus of Cured Product

The reduced modulus of the cured product (a-10-200) was measured in the same manner as in Comparative Example 1. The surface reduced modulus $Er_1$ and the internal reduced modulus $Er_2$ of the cured product (a-10-200) were 3.51 and 2.73 GPa, respectively, and $Er_1/Er_2$ was 1.29.

(4) Observation of Nanoimprint Pattern

It is assumed from the measurement of the reduced modulus of the cured product (a-10-200) that a satisfactory nanoimprint pattern of the curable composition (a-10) free of pattern collapse and other defects can be formed in the same manner as in Comparative Example 1 even at a low exposure dose in the range of 10 to 76 mJ/cm$^2$.

Tables 1, 2, and 3 summarize the results of the exemplary embodiments and comparative examples.

TABLE 1

Pattern collapse evaluation results for low exposure dose (76 mJ/cm$^2$ or less) and surface and internal reduced moduli and ratio thereof of cured product cured at exposure dose in early stage of reduced modulus saturation (200 mJ/cm$^2$)

| | Curable composition | Exposure dose (mJ/cm$^2$) | | | | | | $Er_1$ (GPa) | $Er_2$ (GPa) | $Er_1/Er_2$ |
| --- | --- | --- | --- | --- | --- | --- | --- | --- | --- | --- |
| | | 10 | 19 | 29 | 38 | 57 | 76 | | | |
| Exemplary embodiment 1 | a-1 | X | ○ | ○ | ○ | ○ | ○ | 4.33 | 2.87 | 1.51 |
| Exemplary embodiment 2 | a-2 | ○ | ○ | ○ | ○ | ○ | ○ | 5.10 | 2.90 | 1.76 |
| Exemplary embodiment 3 | a-3 | ○ | ○ | ○ | ○ | ○ | ○ | 5.75 | 3.51 | 1.64 |
| Comparative example 1 | b-1 | X | X | X | X | X | X | 3.39 | 3.21 | 1.06 |
| Comparative example 2 | b-2 | X | X | X | X | X | X | 2.90 | 3.04 | 0.953 |

Symbol ○: A satisfactory pattern free of pattern collapse and other defects
Symbol X: A pattern having a defect, such as pattern collapse
$Er_1$: Surface reduced modulus of a cured product
$Er_2$: Internal reduced modulus of a cured product Exposure dose in an early stage of reduced modulus saturation: Exposure dose in an early stage in which the reduced modulus is substantially constant as a result of progress in curing First examined is the relationship between the pattern collapse evaluation result for the low exposure dose (76 mJ/cm$^2$ or less) and the curable composition. A comparison of Exemplary Embodiments 1 and 2 with Comparative Examples 1 and 2 shows that the evaluation results of pattern collapse at the low exposure dose depend significantly on the addition and type of the surfactant component (C). A comparison of Exemplary Embodiment 3 with Comparative Example 1 showed that the evaluation results of pattern collapse at the low exposure dose also depend significantly on the type of the photopolymerization initiator component (B).

The measurement results of the surface and internal reduced moduli of the cured product show that the internal reduced modulus $Er_2$ of the cured product in Exemplary Embodiments 1 to 3 is lower than that of Comparative Examples 1 and 2. However, pattern collapse at the low exposure dose (76 mJ/cm² or less) is suppressed in Exemplary Embodiments 1 to 3. The ratio $Er_1/Er_2$ of the surface reduced modulus $Er_1$ to the internal reduced modulus $Er_2$ of the cured product in Exemplary Embodiments 1 to 3 is greater than that in Comparative Examples 1 and 2. This means that a hard layer is formed on the surface of the cured product.

The ratio $Er_1/Er_2$ of the surface reduced modulus $Er_1$ to the internal reduced modulus $Er_2$ of the cured product cured at an exposure dose in the early stage of reduced modulus saturation (200 mJ/cm²) tends to be maintained even when the curable composition is cured at the low exposure dose.

Thus, the curable compositions having $Er_1/Er_2 \geq 1.10$ according to Exemplary Embodiments 1 to 3 are curable compositions for nanoimprinting that can form a cured product that has a sufficiently cured surface and is less prone to a pattern collapse defect even when the curable compositions are cured by a photo-nanoimprint method at the low exposure dose.

TABLE 2

Surface and internal reduced moduli and ratio thereof of cured product cured at exposure dose in early stage of reduced modulus saturation (200 mJ/cm²)

| | Curable composition | $Er_1$ (GPa) | $Er_2$ (GPa) | $Er_1/Er_2$ |
|---|---|---|---|---|
| Exemplary embodiment 4 | a-4 | 5.90 | 4.04 | 1.46 |
| Exemplary embodiment 5 | a-5 | 6.02 | 4.00 | 1.51 |
| Exemplary embodiment 6 | a-6 | 4.20 | 3.76 | 1.12 |
| Exemplary embodiment 7 | a-7 | 4.60 | 3.84 | 1.20 |
| Exemplary embodiment 8 | a-8 | 5.12 | 3.64 | 1.41 |
| Comparative example 3 | b-3 | 3.54 | 3.87 | 0.915 |

$Er_1$: Surface reduced modulus of a cured product
$Er_2$: Internal reduced modulus of a cured product Exposure dose in an early stage of reduced modulus saturation: Exposure dose in an early stage in which the reduced modulus is substantially constant as a result of progress in curing

TABLE 3

Surface and internal reduced moduli and ratio thereof of cured product cured at exposure dose in early stage of reduced modulus saturation (200 mJ/cm²)

| | Curable composition | $Er_1$ (GPa) | $Er_2$ (GPa) | $Er_1/Er_2$ |
|---|---|---|---|---|
| Exemplary embodiment 9 | a-9 | 5.57 | 3.47 | 1.61 |
| Exemplary embodiment 10 | a-10 | 3.51 | 2.73 | 1.29 |

$Er_1$: Surface reduced modulus of a cured product
$Er_2$: Internal reduced modulus of a cured product Exposure dose in an early stage of reduced modulus saturation: Exposure dose in an early stage in which the reduced modulus is substantially constant as a result of progress in curing While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-097768, filed May 9, 2014, No. 2014-151501, filed Jul. 25, 2014, and No. 2014-257799, filed Dec. 19, 2014, which are hereby incorporated by reference herein in their entirety.

INDUSTRIAL APPLICABILITY

As described above, the present invention provides a photocurable composition for nanoimprinting that can form a cured product that has a sufficiently cured surface and is less prone to a pattern collapse defect even when the photocurable composition is cured at a low exposure dose. The present invention also provides a nanoimprint method for forming such a cured product. A method for producing a film according to the present invention can be utilized to manufacture cured products, optical components, circuit boards, electronic components, and electronic equipment.

The invention claimed is:

1. A curable composition that satisfies the following formula (1) in a cured state:

$$Er_1/Er_2 \geq 1.10 \qquad (1)$$

wherein $Er_1$ denotes a surface reduced modulus (GPa) of a cured product of the curable composition, and $Er_2$ denotes an internal reduced modulus (GPa) of the cured product.

2. The curable composition according to claim 1, comprising:
a polymerizable compound component (A); and
a photopolymerization initiator component (B),
wherein the cured state is a cured product of the curable composition cured at an exposure dose of 200 mJ/cm² has an average film thickness of 3.2 μm:
wherein $Er_1$ denotes an average reduced modulus (GPa) in a depth range of 4 nm or less from a surface of the cured product, and $Er_2$ denotes a reduced modulus (GPa) at a depth of 200 nm from the surface of the cured product.

3. The curable composition according to claim 1, wherein $Er_1$ is an average surface reduced modulus (GPa) of the cured product measured with a nanoindenter and determined by a Hertz method, and
$Er_2$ is an internal reduced modulus (GPa) of the cured product measured with a nanoindenter and determined by an Oliver-Pharr method.

4. The curable composition according to claim 1, further satisfying the following formula (3):

$$Er_1 \geq 3.00 \tag{3}$$

wherein $Er_1$ denotes a surface reduced modulus (GPa) of the cured product.

5. The curable composition according to claim 1, wherein the component (A) is composed mainly of a monofunctional (meth)acrylic compound and/or a polyfunctional (meth)acrylic compound.

6. The curable composition according to claim 1, wherein the component (A) contains at least one of isobornyl acrylate, benzyl acrylate, 2-naphthylmethyl acrylate, dicyclopentanyl acrylate, m-xylylene diacrylate, dimethyloltricyclodecane diacrylate, phenylethylene glycol diacrylate, 1,10-decanediol diacrylate, and neopentyl glycol diacrylate.

7. The curable composition according to claim 1, wherein the component (A) is composed mainly of a (meth)acrylic compound, and 20% by weight or more of the component (A) is a polyfunctional (meth)acrylic compound.

8. The curable composition according to claim 1, wherein the component (A) is composed mainly of a (meth)acrylic compound, and 30% by weight or more of the component (A) is a (meth)acrylic compound having a ring structure.

9. The curable composition according to claim 1, wherein the component (A) is composed mainly of dicyclopentanyl acrylate and m-xylylene diacrylate, and the weight ratio of dicyclopentanyl acrylate to m-xylylene diacrylate ranges from 40:60 to 60:40.

10. The curable composition according to claim 1, wherein the component (B) contains at least one of alkylphenone polymerization initiator[s] and acylphosphine oxide polymerization initiator[s].

11. The curable composition according to claim 1, wherein the component (B) contains at least one of 2-benzyl-2-dimethylamino-1-(4-morpholinophenyl)-butanone-1 and 2,4,6-trimethylbenzoyldiphenylphosphine oxide.

12. The curable composition according to claim 1, wherein the component (A) is composed mainly of dicyclopentanyl acrylate and m-xylylene diacrylate, the weight ratio of dicyclopentanyl acrylate to m-xylylene diacrylate ranges from 40:60 to 60:40, and the amount of component (B) ranges from 0.01% to 10% by weight of the total amount of the component (A).

13. The curable composition according to claim 1, further comprising at least one of fluorosurfactants and hydrocarbon surfactants as an internal release agent.

14. The curable composition according to claim 1, further comprising at least one sensitizer having a benzophenone structure.

15. The curable composition according to claim 1, further comprising at least one hydrogen donor having a benzophenone structure.

16. The curable composition according to claim 1, wherein the curable composition has a viscosity of 1 cP or more and 100 cP or less.

17. The curable composition according to claim 1, wherein the curable composition is a composition for photo-nanoimprinting.

18. A cured product of the curable composition according to claim 1.

19. A method for producing a patterned film, comprising:
a step [1] of placing the curable composition according to claim 1 on a substrate;
a step [2] of bringing the curable composition into contact with a mold having an original pattern to be transferred;
a step [3] of aligning the substrate with the mold;
a step [4] of forming a cured film by photoirradiation of the curable composition; and
a step [5] of separating the cured film from the mold.

20. The method for producing a patterned film according to claim 19, wherein the mold in the step of bringing the curable composition into contact with a mold having an original pattern to be transferred has a pattern height of 4 nm or more and 200 nm or less and an aspect ratio of 1 or more and 10 or less.

21. The method for producing a patterned film according to claim 19, wherein the exposure dose in the step of forming a cured film by photoirradiation of the curable composition is 90 mJ/cm$^2$ or less.

22. The method for producing a film according to claim 19, wherein the mold contact step is performed in an atmosphere containing a condensable gas.

23. The method for producing a film according to claim 22, wherein the condensable gas is 1,1,1,3,3-pentafluoropropane.

24. The method for producing a film according to claim 22, wherein the atmosphere containing a condensable gas is a gas mixture of helium and the condensable gas.

25. A method for manufacturing an optical component, comprising a step of forming a patterned film by the method for producing a film according to claim 19.

26. A method for manufacturing a circuit board, comprising: a step of forming a patterned film by the method for producing a film according to claim 19; and a step of subjecting the substrate to etching or ion implantation using the patterned film as a mask.

27. The method for manufacturing a circuit board according to claim 26, wherein the circuit board is a semiconductor device.

28. A method for manufacturing an electronic component, comprising a step of forming a patterned film by the method for producing a film according to claim 19.

29. A curable composition, comprising:
a polymerizable compound component (A); and
a photopolymerization initiator component (B),
wherein the curable composition satisfies the following formula (1) when a cured product of the curable composition cured at an exposure dose of 200 mJ/cm$^2$ has an average film thickness of 3.2 µm:

$$Er_1/Er_2 \geq 1.10 \tag{1}$$

wherein $Er_1$ denotes an average reduced modulus (GPa) in a depth range of 4 nm or less from a surface of the cured product, and $Er_2$ denotes a reduced modulus (GPa) at a depth of 200 nm from the surface of the cured product.

30. The curable composition according to claim 1, wherein the curable composition is adjusted such that a concentration distribution of the composition differs between an upper layer and an inner layer of a film in a case where the curable composition is made into the film.

31. The curable composition according to claim 1, further comprising a surfactant containing a perfluoroalkyl group or a long-chain alkyl group, and polyalkylene oxide group having 2 to 4 carbon atoms.

* * * * *